United States Patent
Maejima et al.

(10) Patent No.: US 7,518,922 B2
(45) Date of Patent: Apr. 14, 2009

(54) NAND TYPE FLASH MEMORY

(75) Inventors: Hiroshi Maejima, Tokyo (JP); Katsuaki Isobe, Yokohama (JP); Takumi Abe, Yokohama (JP); Ken Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/749,214

(22) Filed: May 16, 2007

(65) Prior Publication Data

US 2007/0280031 A1  Dec. 6, 2007

(30) Foreign Application Priority Data

May 18, 2006  (JP)  ............... 2006-139280

(51) Int. Cl.
  *G11C 16/04*  (2006.01)
(52) U.S. Cl. ............... 365/185.17; 365/185.33; 365/227
(58) Field of Classification Search ............. 365/185.12
See application file for complete search history.

(56) References Cited

U.S. PATENT DOCUMENTS 5,570,315 A * 10/1996 Tanaka et al. .......... 365/185.22
6,999,371 B2 * 2/2006 Nii ............................ 365/227
2005/0078519 A1  4/2005 Shiga
2006/0092746 A1  5/2006 Nii

FOREIGN PATENT DOCUMENTS

| JP | 2005-44456 | 2/2005 |
| JP | 2005-116132 | 4/2005 |
| KR | 2003-0078124 | 10/2003 |

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

A NAND type flash memory included with a memory cell array composed of a plurality of electronically rewritable memory cells arranged in a matrix shape, and a data inversion control section which judges whether a polarity of a "1" data or a "0" data is to be inverted based on the number of the "1" data and the "0" data of the data when data is sent to the plurality of memory cells within a simultaneous write data unit and inverts the data and in the case where it is sent to the memory cell array adds an inversion flag bit to the data which shows the inversion of the polarity.

21 Claims, 19 Drawing Sheets

NAND TYPE FLASH MEMORY

CROSS-REFERENCE TO RELATED MATERIALS

This application is based upon and claims the benefit of priority from the prior Japanese Patent Applications No. 2006-139280, filed on May 18, 2006, the entire content of which is incorporated herein by reference.

TECHNICAL FIELD

This invention relates to NAND type flash memory which fulfils the conditions of a memory cell array whereby electronically rewritable memory cells are placed in a matrix shape.

BACKGROUND TO THE INVENTION

In the NAND type flash memory device there is a problem whereby in order to meet the two demands of large capacity and high speed, a page length has increased and this has caused a great increase in electric current. In the present NAND type flash memory, the bit line shield type SA (SA; sense amp) method or the all bit read out type SA method are widely known.

In both of these methods, because more than 4 Kbytes of data length is written at once at the time of program operation the peak current in order to charge a bit line increases. In the bit line shield type SA method and the all bit line read out type SA method, especially since nearly 90% of a bit lines capacity is the capacity of the bit line that adjoins it, in the bit line data, because the required charge to charge a bit line where "1" data and "0" data are lined in an alternating pattern increases, the peak current increases.

Also, in the NAND type flash memory device which uses the all bit line read out type SA, the consumption of current at the time of read also increases. Because this is to suppress bit line noise in the all bit line read out type SA method, in order to discharge cell current so that the bit line voltage becomes constant it is unavoidable that current consumption will increase, particularly, as the number of erasure state cells increase so does current consumption.

In both the bit line shield type SA method and the all bit line read out type SA method, as the length of a simultaneous write page becomes greater at the time of program operation so does the peak current for the bit line charge. The peak current is designed so that at a simultaneous write of 4 Kbyte page length, about 100 mA is suppressed. If the page length increases by 2 or 4 times and if the bit line charge speed is to be maintained then the peak current will increase to over 100 mA. Attempting to suppress the peak current will make the bit line charge speed slower.

According to the write method by hot-carrier injection used in a NOR flash memory for example, the number of simultaneous writes is restricted by the write current to the cell itself. However, in the NAND type flash memory device, because the write method to the cell is conducted by a tunneling effect the write current to the cell itself does not become a problem but the current for the bit line charge does. Also, a semiconductor memory device which reduces data read out time and standby power consumption (for example, Japanese Patent application Laid Open No. 2005-44456) is proposed.

SUMMARY OF THE INVENTION

According to one embodiment of the present invention, a NAND type flash memory comprising:

a memory cell array composed of a plurality of electronically rewritable memory cells arranged in a matrix shape; and a data inversion control section which judges whether a polarity of a "1" data or a "0" data is to be inverted based on the number of the "1" data and the "0" data of the data when data is sent to the plurality of memory cells within a simultaneous write data unit and inverts the data and in the case where it is sent to the memory cell array adds an inversion flag bit to the data which shows the inversion of the polarity.

DETAILED DESCRIPTION OF THE INVENTION

Figure 1:
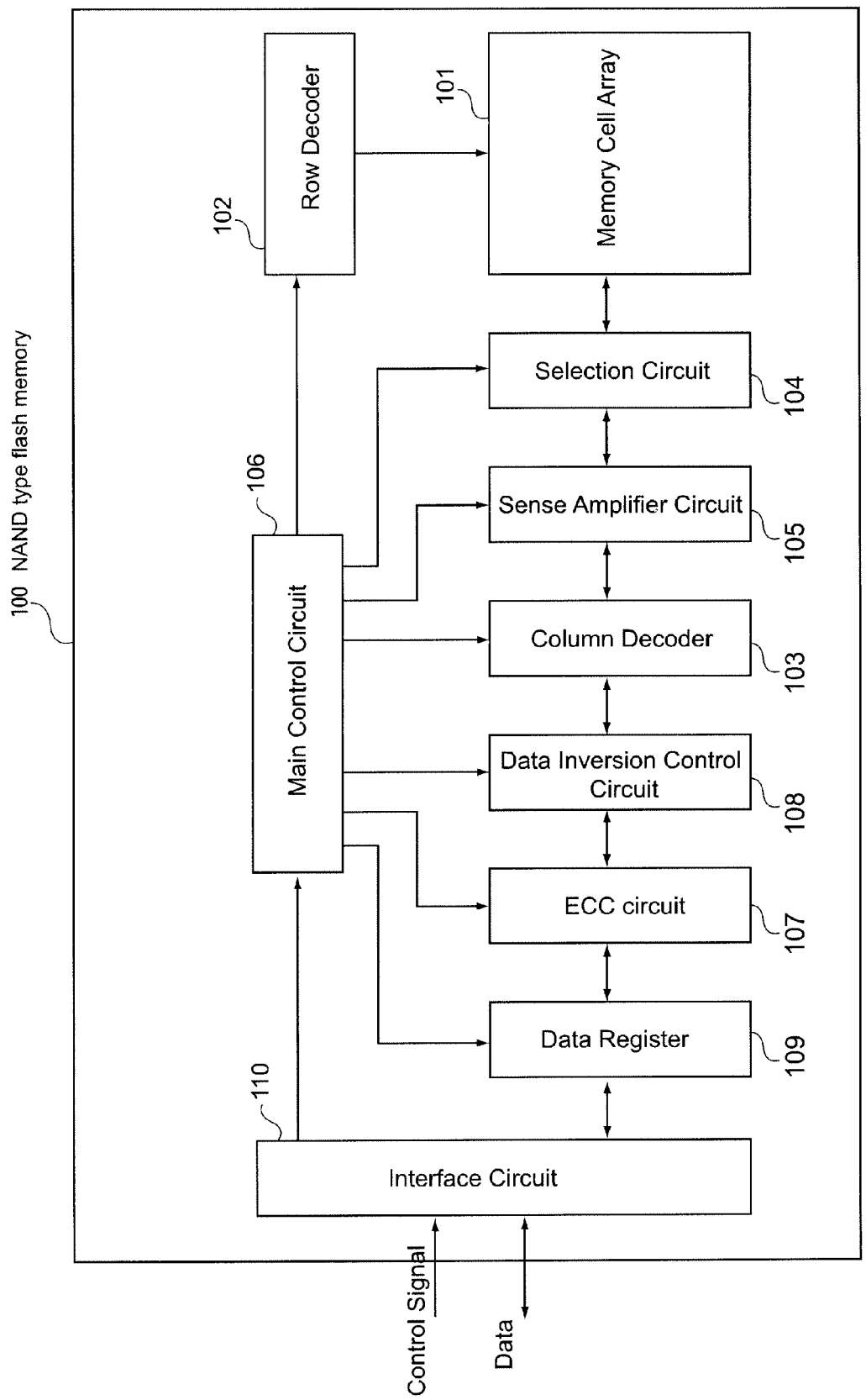
FIG. 1 is a block diagram showing a composition of a first embodiment of a NAND type flash memory in the present invention.

Below, while referring to the drawings, the embodiments of the present invention will be explained in detail. Further, the present invention is not limited to these embodiments.

Embodiment 1

Firstly, while Referring to the drawings, embodiment 1 of the present invention will be explained in detail. FIG. 1 is a block diagram which shows the construction of a NAND type flash memory related to embodiment 1 of this invention.

As shown in FIG. 1, the NAND type flash memory 100 related to embodiment 1 of the present invention is provided with a memory cell array 101, a row decoder 102, a column decoder 103, a selection circuit 104, a sense amplifier circuit 105, a main control circuit 106, an ECC circuit 107, a data inversion control circuit 108, a data register 109 and an interface circuit 110.

Interface circuit 110 performs sending and reception of data and control signals (command and clock signals etc) with external devices. Interface circuit 110 receives data and controls signals from external devices, performs a predefined process and provides main control circuit 106, data register 109 and data inversion control circuit 108.

Main control circuit 106 controls a row decoder 102, column decoder 103, selection circuit 104, sense amplifier circuit 105, ECC circuit 107 and data inversion control circuit 108, based on the control signals received from interface circuit 110.

Main control circuit 106 provides access data to the memory cells of memory cell array 101 to row decoder 102 and column decoder 103. Row decoder 102 and column decoder 103 control sense amplifier circuit 105 and selection circuit 104 based on such access data and data and performs read out, program and erasure of the memory cells.

Sense amplifier circuit 105 has several sense amplifiers and is connected to the bit line of memory cell array 101 through the selection circuit, provides data to the bit line and detects the bit line voltage and stores it in a data cache. The main control circuit 106 provides the read data from the memory cell by the sense amplifier 105 which is controlled by the column decoder 103 to an external device through ECC circuit 107, data register 109 and interface circuit 110. The selection circuit 104 selects a data cache which is connected to a bit line from amongst a plurality of data caches which compose sense amplifier 105.

The ECC circuit 107 checks for any data errors in the sending and reception of data between data register 109 and data inversion control circuit 108 and corrects them. The data inversion control circuit 108 has a function which inverts the polarity of data "1" or data "0" based on the number of data "1" and "0" of a plurality of memory cells within a simultaneous program data unit in memory cell array 110.

Next, while referring to the drawings, one example of the memory cell array 101 of the NAND type flash memory device related to embodiment 1 of this invention will be explained in detail.

Figure 2:
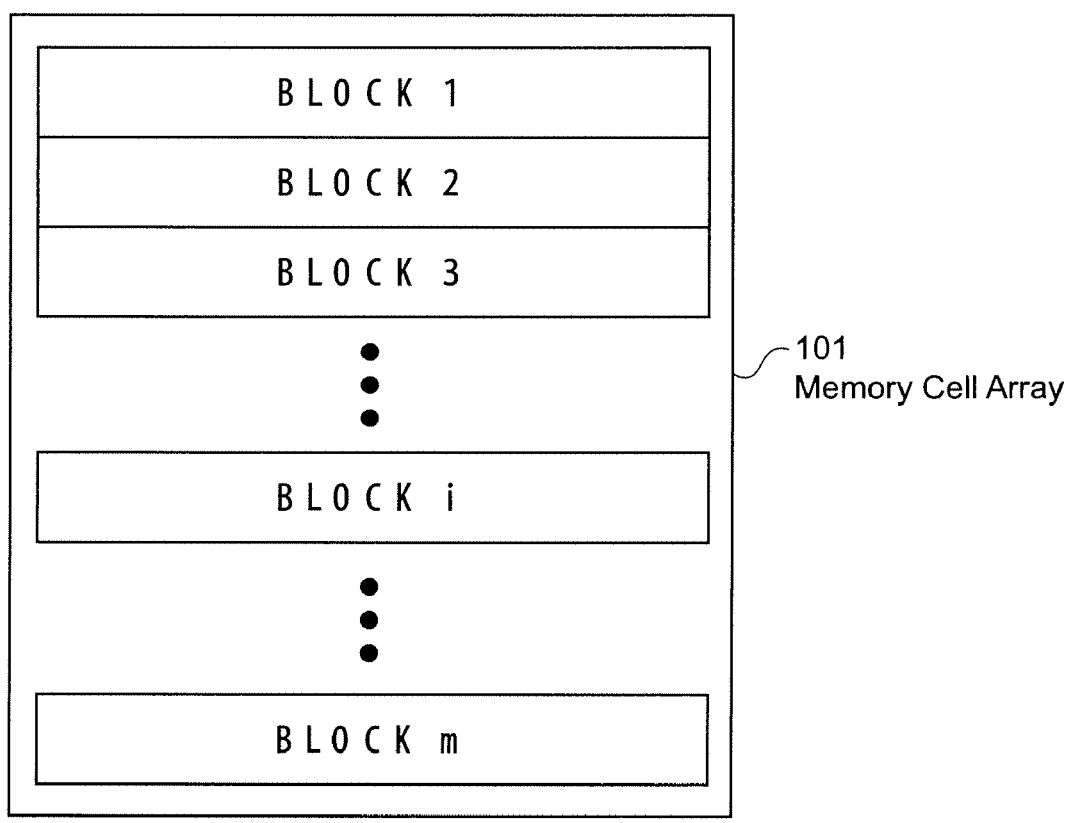
FIG. 2 is a block diagram showing a composition one example of a memory cell array of the first embodiment of a NAND type flash memory in the present invention.

FIG. 2 is a block diagram which shows one example of the memory cell array 101. As shown in FIG. 2, the memory cell array 101 is provided with m blocks which are separated into BLOCK1, BLOCK2, BLOCK3, ..., BLOCKi, ..., BLOCKm. Here, (BLOCK) is the smallest unit of measure of one time data erasure. BLOCK1, BLOCK2, BLOCK3, ..., BLOCKi, ..., BLOCKm have the same construction.

Figure 3:
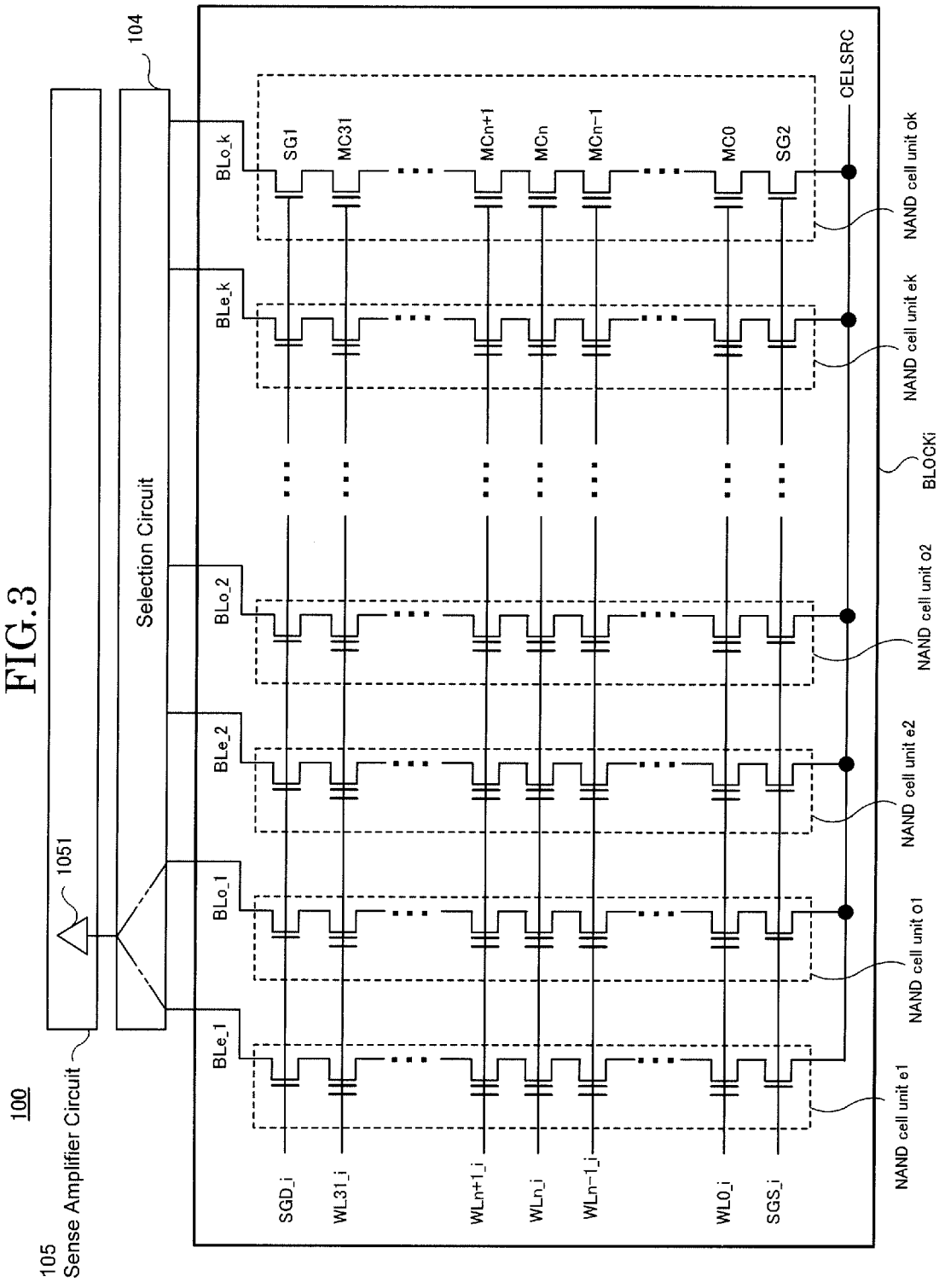
FIG. 3 is a circuit diagram showing one block composition of the memory cell array of the first embodiment of a NAND type flash memory in the present invention.

FIG. 3 is a circuit diagram which shows the construction of one block, BLOCKi, of memory cell array 101. As shown in FIG. 3, BLOCKi of memory cell array 101 is provided with 2×k NAND cell units e1 to ok.

Each NAND cell unit e1 to ok shown in FIG. 3 has 32 memory cells MC0 to MC31. One cell from memory cell MC0 to MC31 is a representative and may be written as memory cell MC. The memory cells MC0 to MC31 are directly connected. One side part of NAND cell unit 1 to k is connected to bit lines BLe_1, BLo_1, Le_2, BLo_2, ..., BLe_i, BLo_i, ..., BLe_k, BLo_k through a selection gate transistor SG1.

The control gate of selection gate transistor SG1 is connected to selection gate SGD_i. Also, the other side part of NAND cell units 1 to k is connected to a common source line CELSRC through a selection gate transistor SG2. The control gate of selection gate transistor SG2 is connected to the selection gate line SGS_i.

Each control gate of memory cells MC0 to MC31 are connected to word lines WL (WL0 to WL31). Even numbered bit lines and an odd numbered bit lines counting from 1 of the bit lines BLe_1, BLe_2, ..., BLe_i, ..., BLe_k independently perform program write and read. Data program and read is performed simultaneously in k memory cells MC which are connected to an even numbered bit line of 2×k memory cells MC which are connected to one word line of word line WLn_i. Each of k memory cells MC stores 1 bit of data. These k memory cells MC are constructed of a unit called a [page].

Similarly, data program and read is performed simultaneously in k memory cells MC which are connected to an odd numbered bit line of 2×k memory cells MC which are connected to one word line of word line WLn_i. Each of k memory cells MC stores 1 bit of data. These k memory cells MC are constructed of a unit called a [page].

Further, the present invention is not limited to embodiment 1 of this invention shown in the drawings and the number of blocks, the number of NAND cell units and the number of memory cells can be changed according to necessity. Also, in embodiment 1 of the present invention each memory cell MC stored 1 bit of data, however, each memory cell MC can record a plurality of data bits (multi bits data) according to the volume of electron injection.

The sense amplifier circuit 105 is provided with a plurality of sense amplifiers 1051. Each of the plurality of sense amplifiers 1051 is selectively connected to one of two bit lines from amongst BLe_1, BLe_2, . . . , BLe_i, . . . , BLe_k; BLo_1, BLo_2, . . . , BLo_i, . . . , BLo_k through selection circuit 104. This sense amplifier 1051 is called a bit line shield type sense amplifier.

The selection circuit 104 selects only one of 2 bit lines based on selection data and is connected to sense amplifier 1051, the other bit line of the 2 bit lines is not selected and not connected to sense amplifier 1051. In this case, the selection circuit 104 reduces the combination noise in the adjacent bit line by grounding the unselected bit line at the time of data read. Also, the selection circuit 104 does not allow data to be written to the memory cell MC by making the non selected bit line VDD during program operation.

Figure 4:
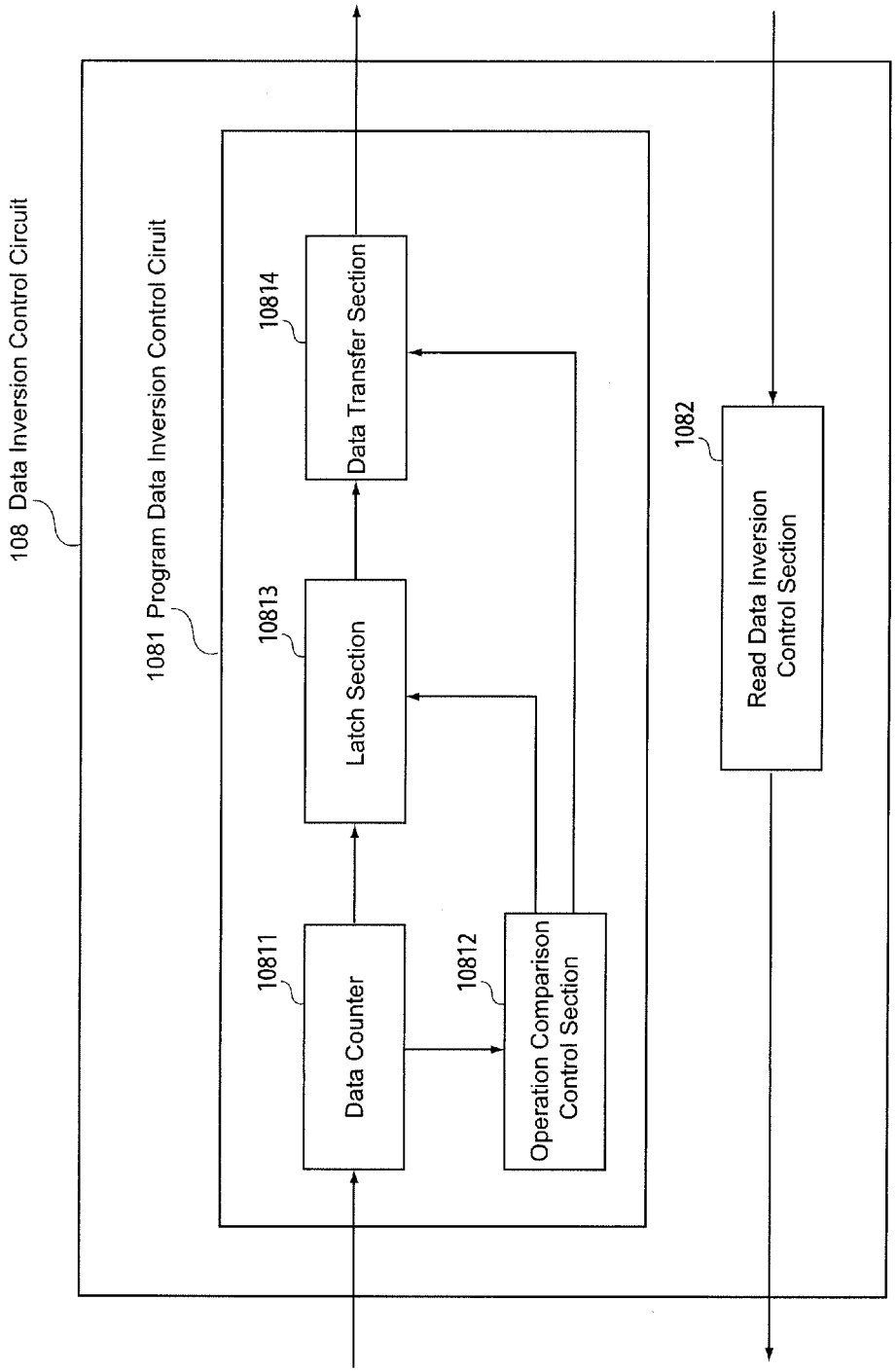
FIG. 4 is a block diagram showing a data inversion control circuit of the first embodiment of a NAND type flash memory in the present invention.

Next, while referring to the drawings, the data inversion control circuit 108 of the NAND type flash memory 100 related to embodiment 1 of this invention will be explained in detail. FIG. 4 is a block diagram which shows data inversion control circuit 108 of the NAND type flash memory 100 related to embodiment 1 of the present invention.

The data inversion control circuit 108 counts the number of "1" data and the number of "0" data of the data of the plurality of memory cell MC within the simultaneous program data unit and generates a "1" data counter value and a "0" data counter value, compares the difference between "1" data counter value and a "0" data counter value, generates a comparison result and inverts the polarity of "1" data or "0" data based on the comparison result.

As shown in FIG. 4, the data inversion control circuit 108 is provided with a program data inversion control circuit 1081 and a read data inversion control circuit 1082. The program data inversion control circuit 1081 is provided with a data counter 10811, an operation comparison control section 10812, a latch section 10813 and a data transfer section 10814.

The data counter 10811 receives data from interface circuit 110, data register 109 and ECC circuit 107, counts the number of "1" data and the number of "0" data of the data of the plurality of memory cell MC data within the simultaneous program data unit and generates a "1" data counter value and a "0" data counter value. The data counter 10811 transfers data from interface circuit 110 to latch section 10813 and provides "1" data counter value and "0" data counter value to operation comparison control section 10812.

The operation comparison control section 10812 compares the difference between "1" data counter value and "0" data counter value from data counter 10811 and generates a comparison result. The operation comparison control section 10812 provides the latch section 10813 and the data transfer section 10814 with the inversion data which shows whether data is to be inverted or not when inverting the polarity of "1" data or "0" data based on the comparison result.

The latch section 10813 adds an inversion flag bit, which shows the inversion data from the operation comparison control section 10812, to the data from data counter 10811 and provides it to data transfer section 10814. The data transfer section 10814 inverts or doesn't invert the data from latch section 10813 based on the inversion data from the operation comparison control section 10812 and transfers it to memory cell array 101 through column decoder 103, sense amplifier circuit 105 and selection circuit 104.

Figure 5:
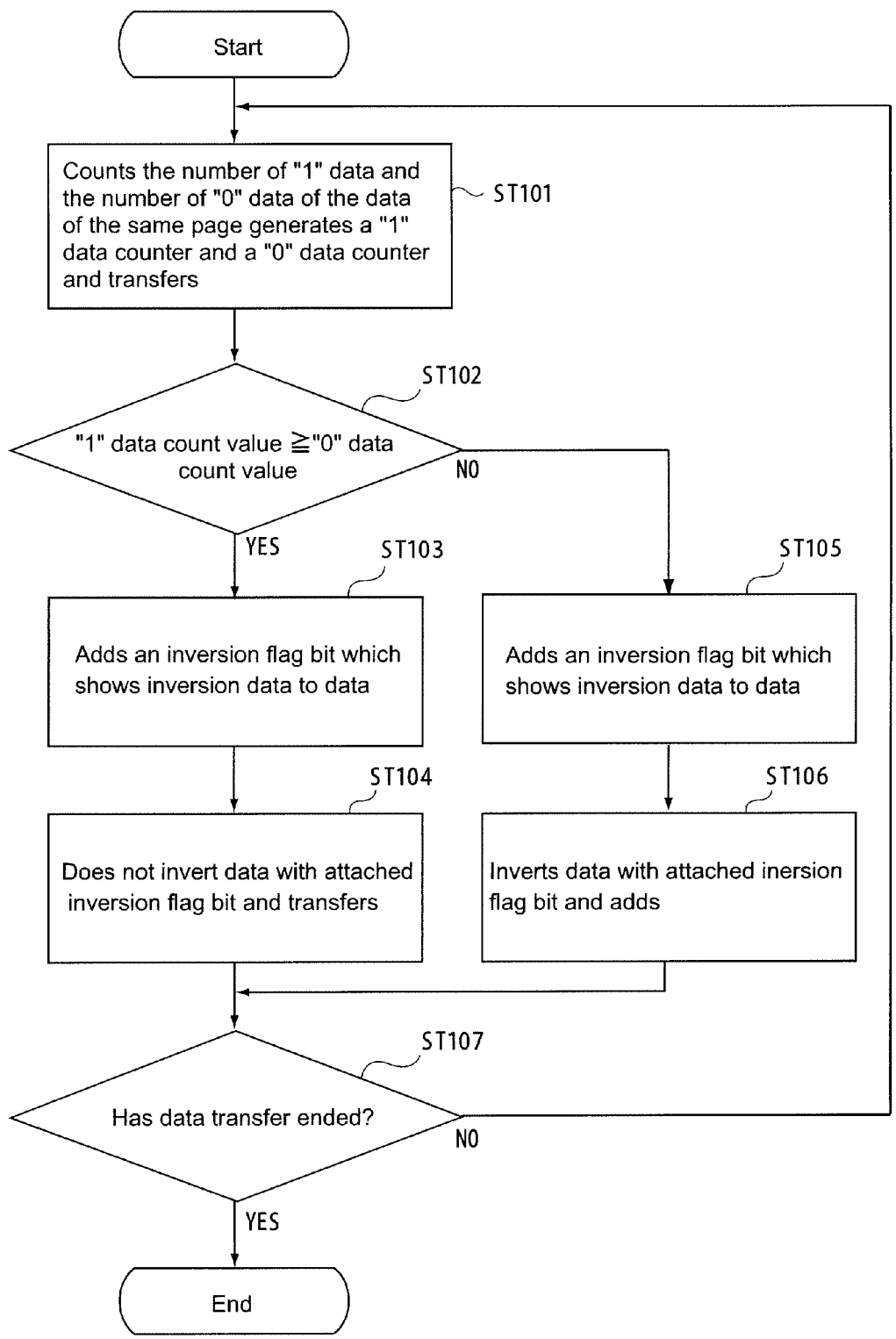
FIG. 5 is flowchart which explains the operation of a data inversion control circuit of the first embodiment of a NAND type flash memory in the present invention.
Figure 6:
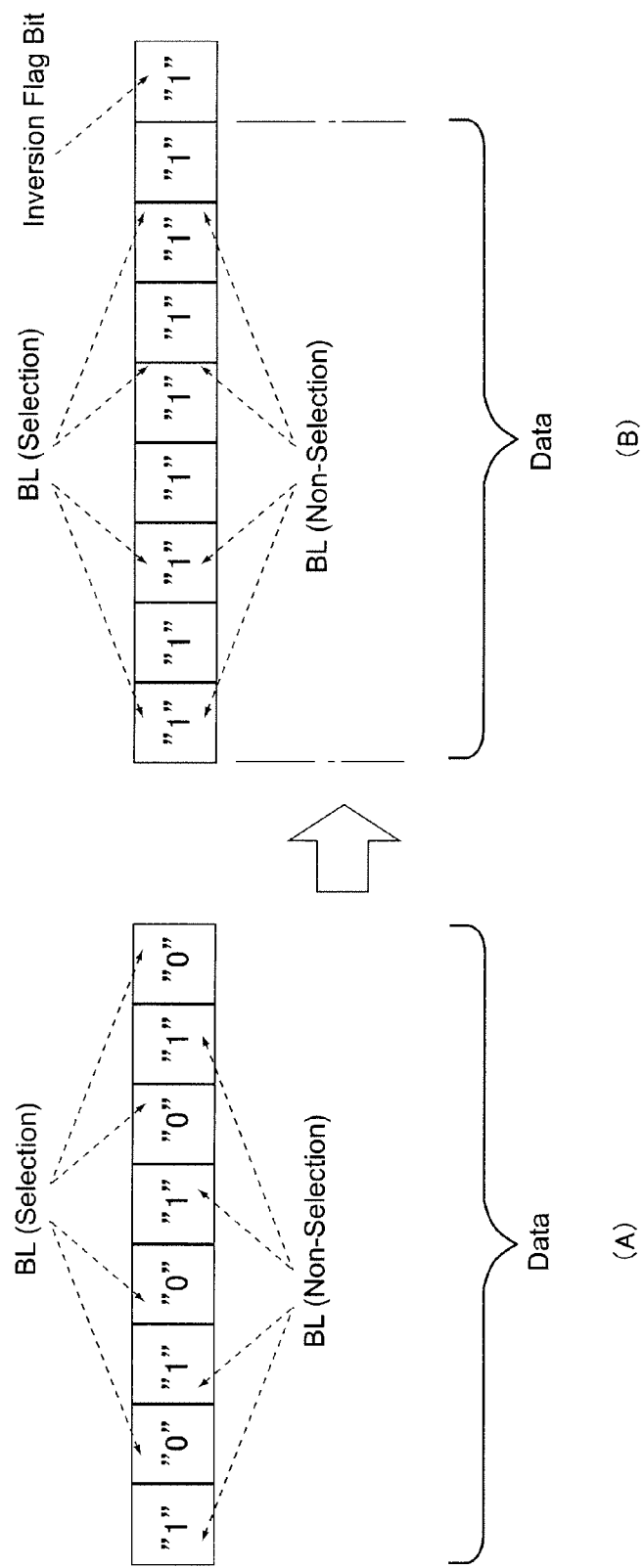
FIG. 6(A) is diagram showing one example of a bit line data pattern which the data inversion control circuit receives of the first embodiment of a NAND type flash memory in the present invention.
FIG. 6(B) is diagram which showing one example of a bit line data pattern which the data inversion control circuit outputs of the first embodiment of a NAND type flash memory in the present invention.

Next, the operation of data inversion control circuit 108 will be explained in further detail. FIG. 5 is a flowchart which explains the operation of data inversion control circuit 108. FIG. 6 is a diagram which explains one example of the operation of data inversion control circuit 108.

As shown in FIG. 5, in step ST101, the data counter 10811 receives the data output from interface circuit 110 through data register 109 and ECC circuit 107, counts the number of "1" data and the number of "0" data of the data of the same page (or an ECC replacement unit within the same page) and generates a "1" data counter value and a "0" data counter value. Then, the data counter 10811 transfers the data output from interface circuit 110 to the latch section 10813 and transfers the "1" data counter value and the "0" data counter value to the operation comparison control section 10812.

Next, in step ST102, the operation comparison control section 10812 compares the difference between "1" data counter value and "0" data counter value transferred from the data counter 10811 and generates a comparison result.

In step ST102 when the comparison result shows that "1" data counter value is more than "0" data counter value, the operation comparison control section 10812 provides inversion data which shows that "1" data or "0" data is not to be inverted, to latch section 10813 and data transfer section 1814.

Next, in step ST103, the latch section 10813 adds an inversion flag bit ("0"), which shows the inversion data provided by operation comparison control section 10812, to the data transferred from data counter 10811 and provides this to data transfer section 10814. Next, in step ST104, the data transfer section 10814 does not invert the data which has an inversion flag bit and transfers it to the memory cell array 101 through column decoder 103, sense amplifier circuit 105 and selection circuit 104.

Also, in step ST102, when the comparison result shows that "1" data counter value is less than "0" data counter value the operation comparison control section 10812 provides the inversion data, which shows that "1" data counter value is to be inverted, to the latch section and data transfer section.

Next, in step ST105, the latch section 10813 adds an inversion flag bit ("1"), which shows the inversion data provided by operation comparison control section 10812, to the data transferred from data counter 10811 and provides this to data transfer section 10814. Next, in step ST106, the data transfer section 10814 inverts the data which has an inversion flag bit and transfers it to the memory cell array 101 through column decoder 103, sense amplifier circuit 105 and selection circuit 104.

For example, when the data of selected bit line has a polarity shown in FIG. 6(A) the latch section 10813 adds an inversion flag bit "1" to the data as shown in FIG. 6(B) because the said comparison result shows that "1" data counter value is less than "0" data counter value and provides this to data transfer section 10814. In this case, the data transfer section 10814 inverts the data and transfers it to the memory cell array 101 through column decoder 103, sense amplifier circuit 105 and selection circuit 104.

As shown in FIG. 5, after the steps ST104 and ST106 the data transfer section 10814 judges whether the transfer of data has ended (step ST107) and the operation returns to step ST101 when the transfer of data has not ended.

Figure 7:
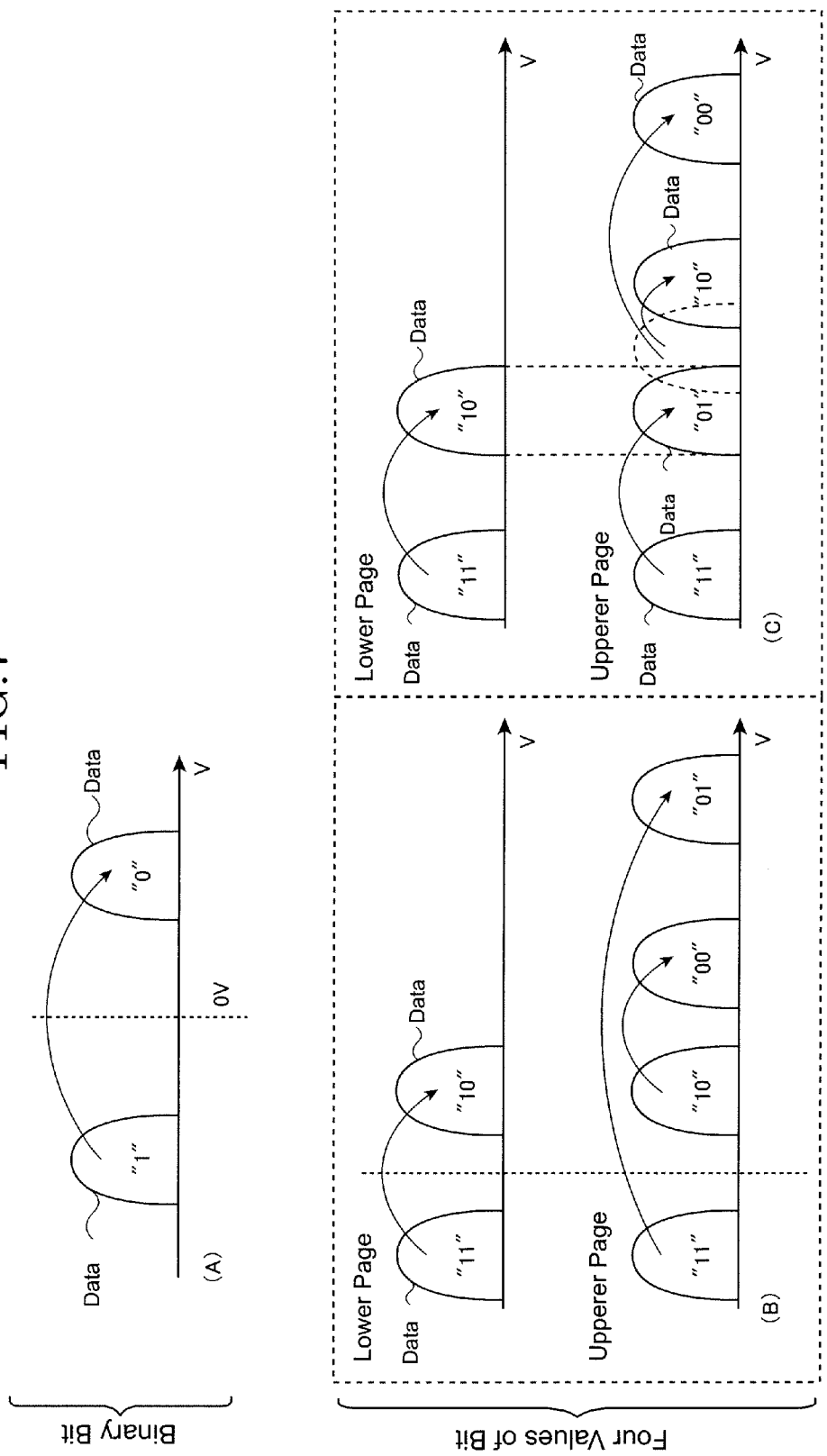
FIG. 7(A) is a diagram which showing one example of a data pattern in the case where a binary data is written at the time of program operation by the bit line shield type SA method of the first embodiment of a NAND type flash memory in the present invention.
FIG. 7(B) is a diagram which showing one example of a data pattern in the case where the four values of data is written at the time of program operation by the bit line shield type SA method of the first embodiment of a NAND type flash memory in the present invention.
FIG. 7(C) is a diagram which showing one example of a data pattern in the case where a four values of data is written at the time of program operation by the bit line shield type SA method of the first embodiment of a NAND type flash memory in the present invention.

FIG. 7 is a diagram showing one example of a data pattern for explaining the method of data programming at the time of program operation by the bit line shield type SA method.

FIG. 7(A) is a diagram showing the data pattern in the case where data of a value 2 is programming at the time of program operation by the bit line shield type SA method. FIG. 7(B) is a diagram showing one example of the data pattern in the case where data of a value 4 is programming at the time of program operation by the bit line shield type SA method. FIG. 7(C) is a diagram showing one example of the data pattern in the case where data of a value 4 is programming at the time of program operation by the bit line shield type SA method.

In the bit line shield type SA method, because the voltage of the non selected bit line is usually VDD the data of the selected bit line is "0", that is, when all are VSS, because the charge needed to charge the bit line is at its highest consumption current is at its highest. Therefore, by counting the number of "0" data (the data loaded by the selected bit line) and the number of "1" data and making sure that the number of "1" data is always more than the number of "0" data it is possible to reduce the current consumption for charging the bit line.

For example, in the case of data program at the time of program operation by the bit line shield type SA method shown in FIGS. 7(A) and (B), it is possible to reduce consumption current for charging the bit line by only 50% at most. Also, in the case of data write at the time of program operation by the bit line shield type SA method shown in FIG. 7(C), it is possible to reduce consumption current for charging the bit line by only 25% at most.

As shown in FIG. 4, in the case where the inversion flag bit shows that the polarity of data has been inverted at the time of reading data stored in the memory cell array 101, the read data inversion control circuit 1082 receives the data from memory cell array 101 through selection circuit 104, sense amplifier circuit 105 and column decoder 103, inverts this data's polarity and provides it to ECC circuit 107. By this, the NAND type memory flash 100 related to embodiment 1 of this invention can return inverted data to its original state and transfer it when it has received data from another device and inverted and stored it.

According to embodiment 1 of the present invention, when a comparison result shows that "1" data counter value is less than "0" data counter value, because the polarity of the "1" data can be inverted and stored in the memory cell, and because the consumption current for charging the bit line in the case of data write can be reduced, it is possible to reduce consumption current at the time of data write.

Embodiment 2

Figure 8:
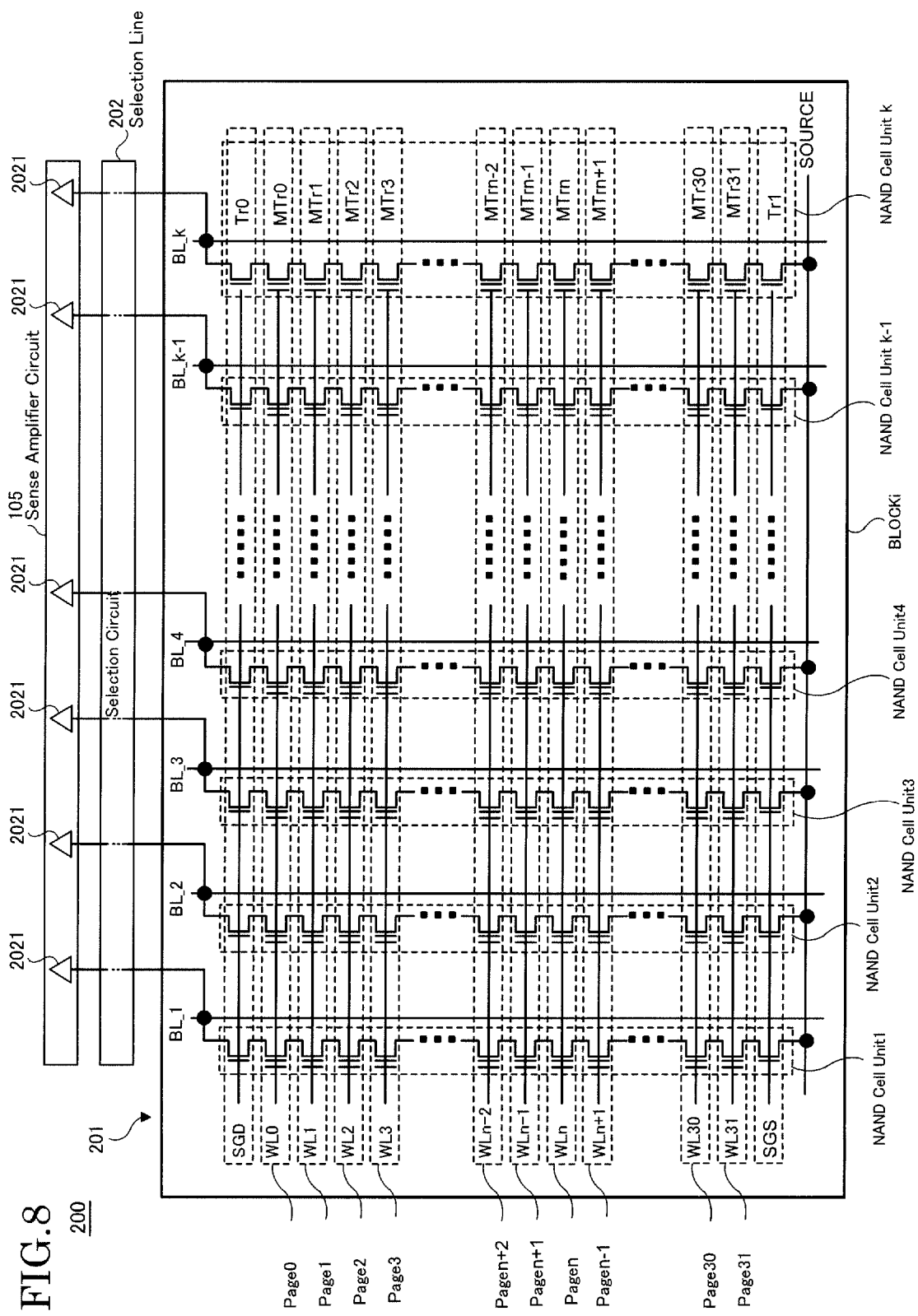
FIG. 8 is circuit diagram which showing one block of the memory cell array of a second embodiment of a NAND type flash memory in the present invention.
Figure 9:
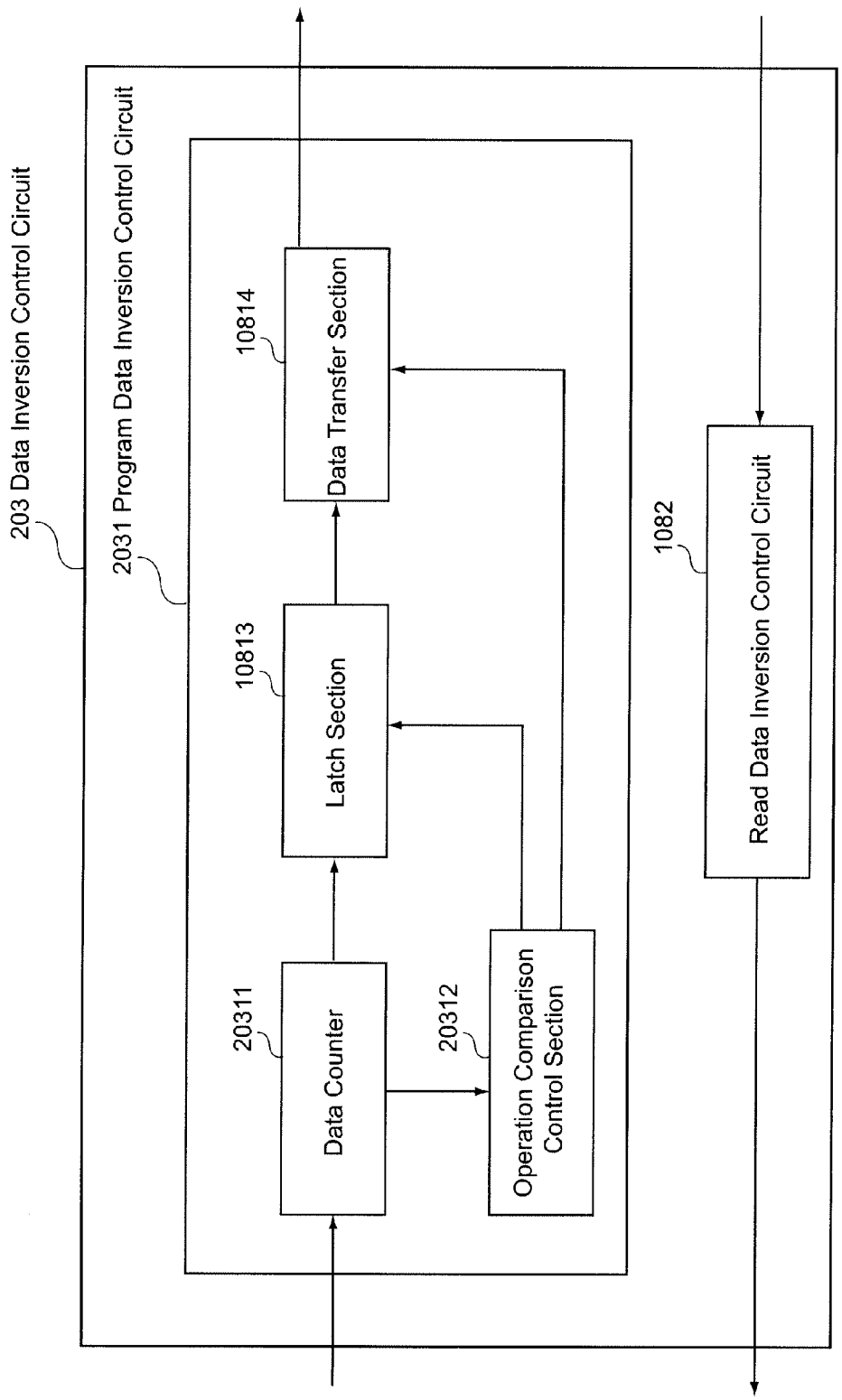
FIG. 9 is a block diagram which showing the data inversion control circuit of the second embodiment of a NAND type flash memory in the present invention.

Next, embodiment 2 will be explained in detail while referring to the drawings. FIG. 8 is a circuit diagram which shows 1 block of the memory cell array 201 of the NAND type flash memory 200 related to embodiment 2 of this invention. FIG. 9 is a block diagram which shows a data inversion control circuit of the NAND type flash memory device 200 related to embodiment 2 of the present invention. In embodiment 2 of this invention, because the same reference symbols have been attached, the same component parts as embodiment 1 they will not be explained here.

As shown in FIG. 1, FIG. 8 and FIG. 9, the NAND type flash memory 200 related to embodiment 2 of this invention has, instead of the memory cell array 101, selection circuit 104 and data inversion control circuit 108 of the NAND type flash memory 100 related to embodiment 1 of this invention, a memory cell array 201, a selection circuit 202 and a data inversion control circuit 203.

That is, the NAND type flash memory 200 related to embodiment 2 of this invention is provided with a memory cell array 201, a row decoder 102, a column decoder 103, a selection circuit 202, a sense amplifier circuit 105, a control circuit 106, an ECC circuit 107, a data inversion control circuit 203, a data register 109 and an interface circuit 110.

As shown in FIG. 8, BLOCKi of memory cell array 201 is provided with k NAND cell units 1 to k Each of the NAND cell units 1 to k shown in FIG. 8 has 32 memory cells MTr0 to MTr31. One of the cells from memory cells MTr0 to MTr31 is a representative and may be also written as memory cell MTr. The memory cells MTr0 to MTr31 are directly connected. One end of the NAND cell unit 1 to k is connected to bit lines BL_1, BL_2, . . . , BL_i, . . . , BL_k through a election gate resistor Tr0.

The control gate of selection gate transistor Tr0 is connected to selection gate line SGD. The other end of NAND cell unit 1 to k is connected to a common source SOURCE through a selection gate transistor Tr1. The control gate of selection gate transistor Tr1 is connected to selection gate line SGS.

Each control gate of the memory cells MTr0 to MTr31 are connected to word lines WL0 to WL31. Each of k memory cells MTr which are connected to one word line of word lines WL0 to WL31, store 1 bit of data. These k memory cells MTr are composed of a unit called a (page).

Further, the present invention is not limited to embodiment 2 of the present invention showed in the diagrams and the number of blocks, number of NAND memory units and memory cells can be changed according to necessity. Also, in embodiment 2 of the present invention, each memory cell MTr stores one bit of data, however, it is possible to make each memory cell MTr store several bits of data (multi bit data) according to electron injection.

The sense amplifier circuit 202 is provided with several sense amplifiers 2021. Each of the sense amplifiers 2021 are connected to bit lines BL_1, BL_2, . . . , BL_i, . . . , BL_k through selection circuit 202. This sense amplifier 2021 is called an all bit read out type sense amplifier. At the time of data read out, by maintaining the bit lines BL_1, BL_2, . . . , BL_i, . . . , BL_k at a constant voltage, embodiment 2 removes the combination noise between the adjacent bit lines BL_1, BL_2, . . . , BL_i, . . . , BL_k and performs a simultaneous read out of the adjacent bit lines BL_1, BL_2, . . . , BL_i, . . . , BL_k. Also, in embodiment 2, according to the program operation, because it is possible to program the data of the sense amplifier BL_1, BL_2, . . . , BL_i, . . . , BL_k all the bit lines simultaneously to the memory cell MTr it is possible to write twice as much data compared to the bit line shield type sense amplifier.

The data inversion control section 203 calculates the exclusive OR (XOR) of the data couple of adjacent even and an odd pages of the memory cell array 101, and has a function which inverts the polarity of data of an even or odd page so that the number of adjoining "1" data and "2" data becomes fewer.

As shown in FIG. 9, the data inversion control circuit 203 is provided with a program data inversion control circuit 2031 and a read data inversion control circuit 1082. The program data inversion control circuit 2031 is provided with a data counter 20311, an operation comparison control section 20312, a latch section 10813 and a data transfer section 10814.

The data counter 2031 receives data from interface circuit 110 through data register 109 and ECC circuit 107, counts the number of "1" data and "0" data of the data of an even page and the number of "1" data and "0" of the data of an odd page within the same word line (or an ECC replaced unit within the same word line) and generates a count value. The data counter 20311 transfers the data from interface circuit 110 to the latch section 10813 and provides a counter value to the operation comparison control section 20312.

The operation comparison control section 20312 calculates the exclusive OR (XOR) of the data couple of adjacent even and an odd pages of the memory cell array 101, based on the count value from data counter 20311, generates inversion data which inverts the polarity of data of an even or odd page so that the number of adjoining "1" data and "2" data becomes fewer and provides it to latch section 10813 and data transfer section 10814.

The latch section 10813 adds an even page inversion flag bit and an odd page inversion flag bit, which shows the inversion data provided by the operation comparison control section 20312, to the data transferred from the data counter 20311 and provides this to the data transfer section 10814. The data transfer section 10814 inverts or doesn't invert the data transferred from the latch section 10813 based on the inversion data provided by the operation comparison control section 20312 and transfers it to the memory cell array 201 through column decoder 103, sense amplifier circuit 105 and selection circuit 104.

Figure 10:
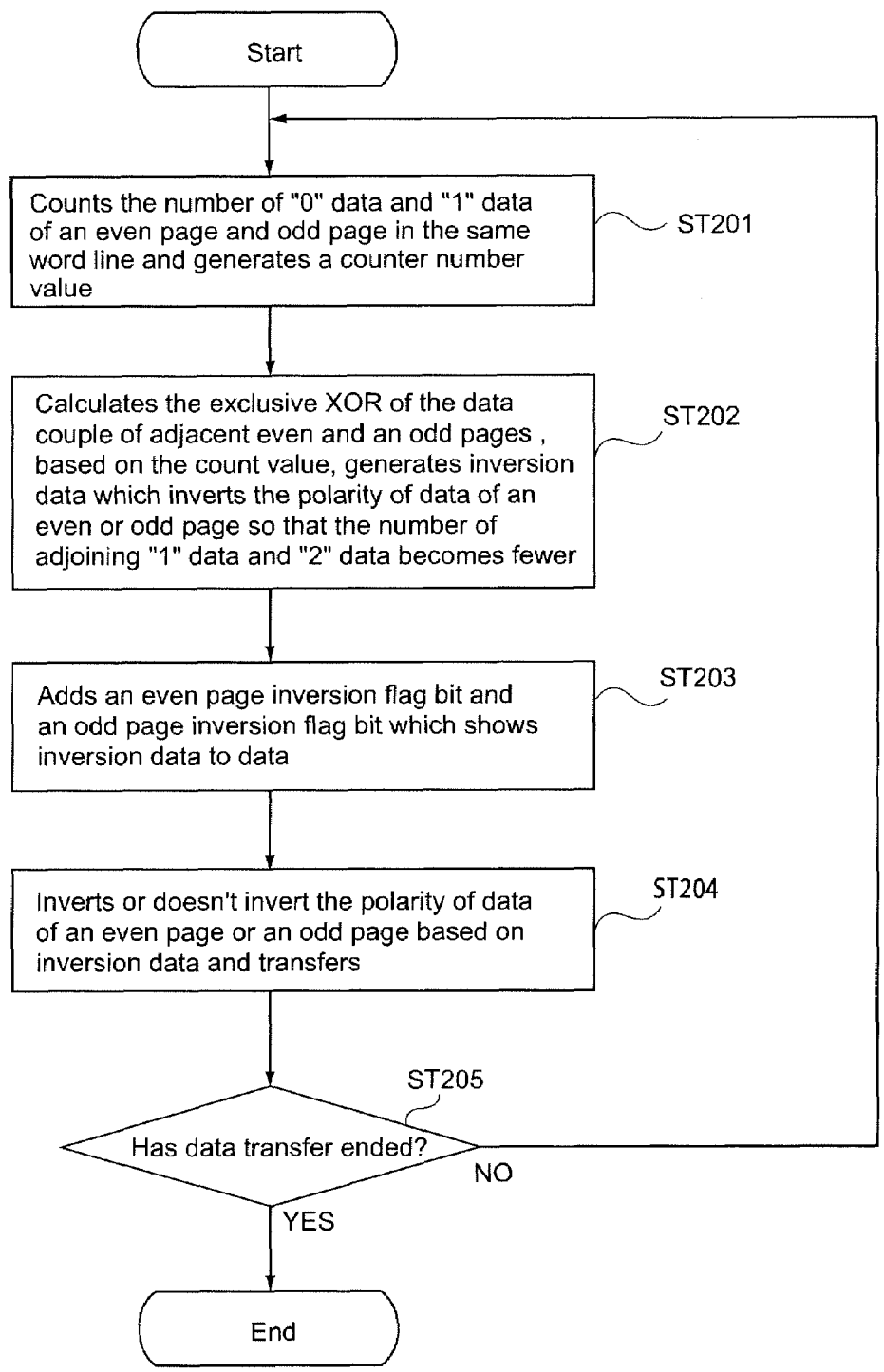
FIG. 10 is a flowchart which explains the operation of the data inversion control circuit of the second embodiment of a NAND type flash memory in the present invention.
Figure 11:
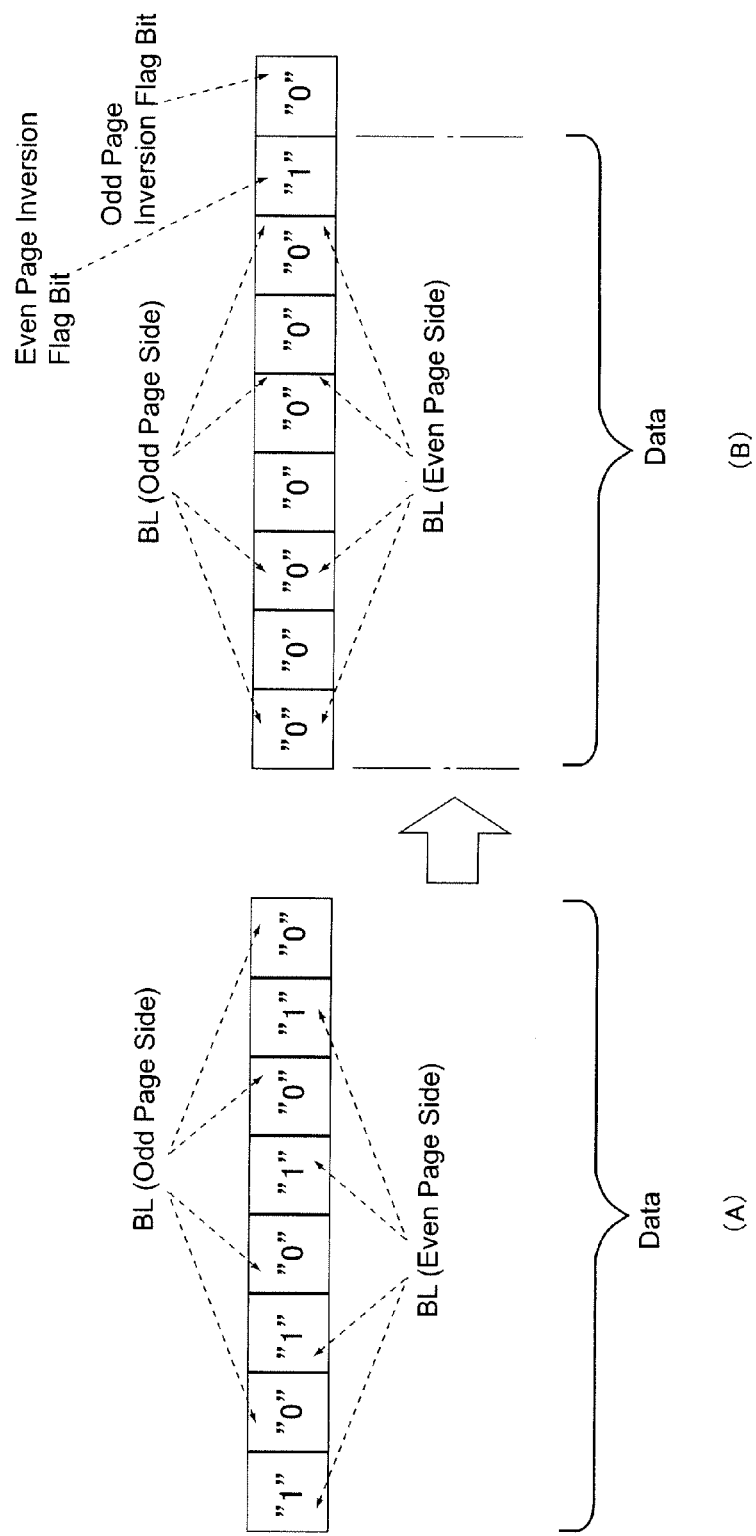
FIG. 11(A) is diagram which showing one example of the bit line data pattern which the data inversion control circuit receives of the second embodiment of a NAND type flash memory in the present invention.
FIG. 11(B) is diagram which showing one example of a data pattern which the data inversion control circuit outputs the second embodiment of a NAND type flash memory in the present invention.

Next, the operation of data inversion control circuit 203 will be explained in further detail. FIG. 10 is a flowchart which explains the operation of data inversion control circuit 203. FIG. 11 is a diagram which explains one example of the operation of data inversion control circuit 203.

As shown in FIG. 10, in step S201 the data counter 20311 counts the number of "1" data and "0" data of the data of an even page and the number of "1" data and "0" of the data of an odd page within the same word line (or a an ECC replaced unit within the same word line) and generates a count value. The data counter 20311 transfers the data from interface circuit 110 to the latch section 10813 and provides a counter value to the operation comparison control section 20312.

Next, in step ST202, the operation comparison control circuit 20312 calculates the exclusive OR (XOR) of the data couple of adjacent even and an odd pages of the memory cell array 101, based on the count value from data counter 20311, generates inversion data which inverts the polarity of data of an even or odd page so that the number of adjoining "1" data and "2" data becomes fewer and provides it to latch section 10813 and data transfer section 10814.

Next, in step ST203, the latch section 10813 adds an even page inversion flag bit and an odd page inversion flag bit, which shows the inversion data provided by the operation comparison control section 20312, to the data transferred from the data counter 20311 and provides this to the data transfer section 10814.

Next, in step ST204, the data transfer 10814 inverts or doesn't invert the data transferred from the latch section 10813 based on the inversion data provided by the operation comparison control section 20312 and transfers it to the memory cell array 201 through column decoder 103, sense amplifier circuit 105 and selection circuit 104.

After step ST204, the data transfer 10814 judges whether the transfer of data has ended (step ST205) and returns to step ST201 if the data transfer has not ended.

For example, in the case where the bit line data has a polarity shown in FIG. 11(A) the operation comparison control section 20312 generates an inversion data which inverts the polarity of data of an even page and provides it to the latch section 10813 and data transfer section 10814. The latch section 10813 adds an odd page inversion flag bit and an even page inversion flag bit to the data as shown in FIG. 11(B) and provides this to the data transfer section 10814. The data transfer section 1014 inverts the polarity of the data of an even page and provides this to the memory cell array 201 through the column decoder 103, sense amplifier circuit 105 and the selection circuit 104.

In the all bit line read out type SA method, because data is program simultaneously to all the bit lines which are connected to the same word line, in the case where the number of adjoining "1" data and "0" data is the greatest, in other words, in the case of a data pattern where "1" data and "0" are lined alternately, the required charge for charging a bit line is at its greatest. Therefore, the exclusive OR (XOR) of the data couple of adjacent even and an odd pages is calculated, the number of adjoining "1" data and "0" data are counted and a count value is generated and if the data of the page where the count value becomes fewer is inverted it is possible to reduce the current for charging the bit line. The data which tells whether data inversion has taken place or not can be programming to the inversion flag bit of an even page or the inversion flag bit of an odd page.

According to embodiment 2 of this invention, because it is possible to invert the polarity of data of an odd or even page so that the number of adjoining "1" data and "0" data becomes fewer and store this in the memory cell and because it is possible to reduce the consumption current for charging a bit line in the case of data write it is possible to reduce consumption current for charging a bit line in the case of data program. Also, according to embodiment 2 of this invention, under the condition that the peak current for charging a bit line is constant it is possible to quicken data program operation.

Embodiment 3

Figure 12:
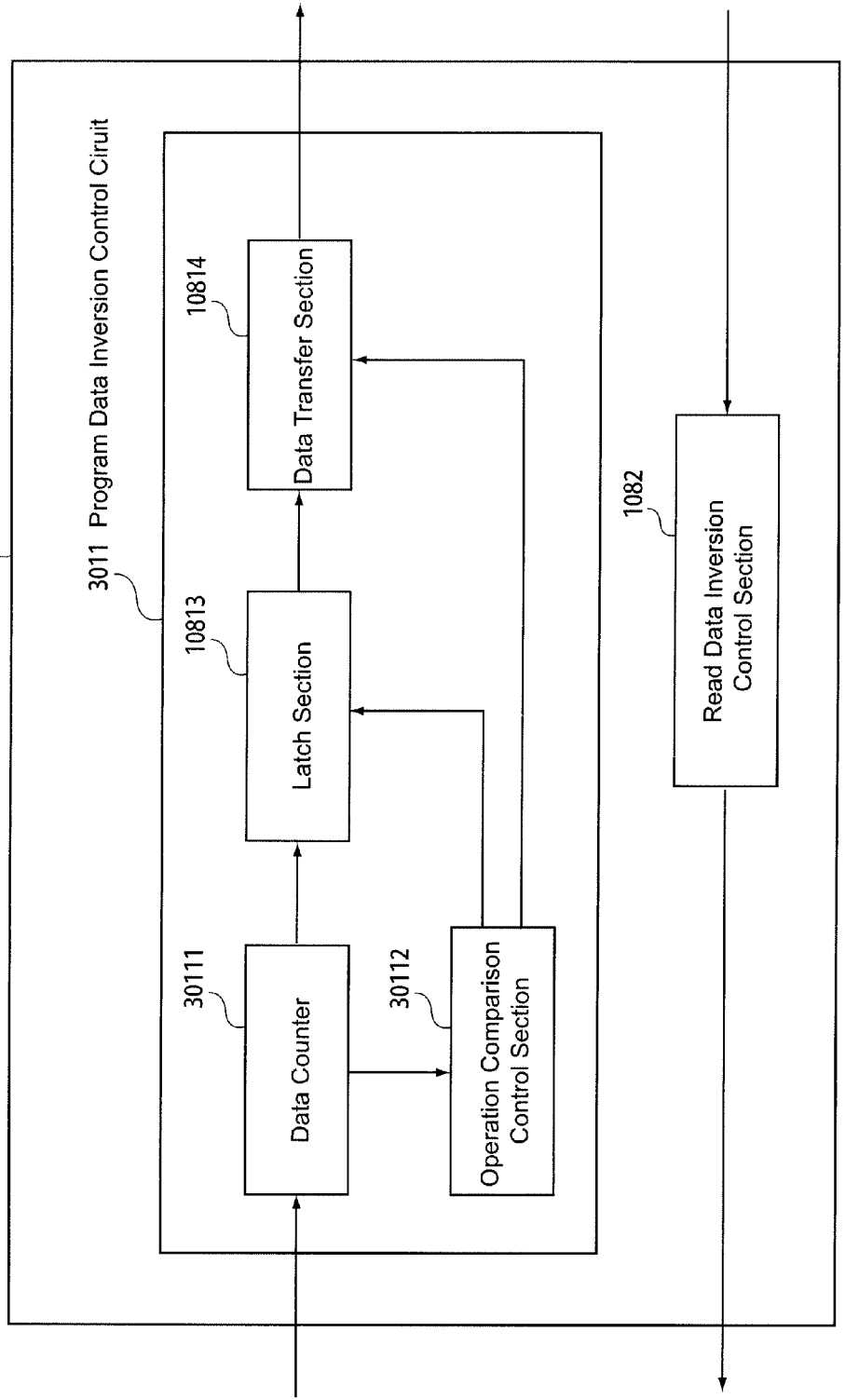
FIG. 12 is block diagram which showing the data inversion control circuit of a third embodiment of a NAND type flash memory in the present invention.

Next, embodiment 3 of the present invention will be explained in detail while referring to the drawings. FIG. 12 is a block diagram which shows a data inversion control circuit of the NAND type flash memory device 300 related to embodiment 3 of this invention. In embodiment 3 of this invention, because the same reference symbols have been attached to the same component parts as embodiment 2, they will not be explained here.

As shown in FIG. 12, the NAND type flash memory 300 related to embodiment 3 of this invention has, instead of the data inversion control circuit 203 of the NAND type flash memory device 200 of embodiment 2 of this invention, a data inversion control circuit 301.

As shown in FIG. 12, the data inversion control circuit 301 is provided with a program data inversion control circuit 3011 and a read data inversion control circuit 1082. The program data inversion control circuit 3011 is provided with a data counter 30111, an operation comparison control section 30112, a latch section 10813 and a data transfer section 10814.

Figure 13:
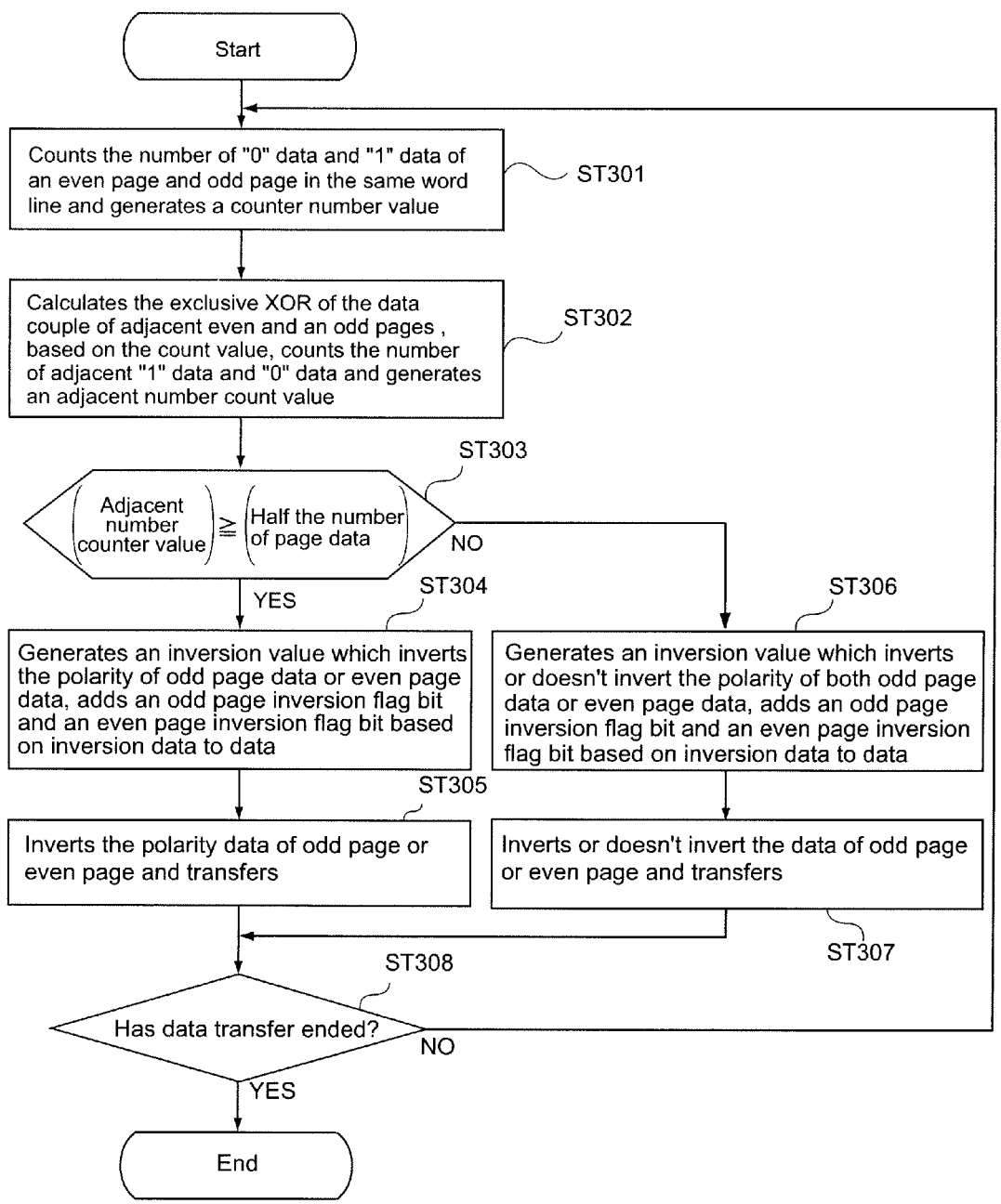
FIG. 13 is a flowchart which explains the operation of the data inversion control circuit of the third embodiment of a NAND type flash memory in the present invention.

FIG. 13 is a flow diagram which explains the operation of data inversion control circuit 301 of a NAND type flash memory device 300 related to embodiment 3 of this invention. Next, the operation of data inversion control circuit 301 of a NAND type flash memory device 300 related to embodiment 3 of this invention will be explained in detail referring to the drawings.

As shown in FIG. 13, in step ST301, the data counter 3011 receives data from the interface circuit 110 through the data register 109 and ECC circuit 107, counts the number of "1" data and "0" data of the data of an even page and the number of "1" data and "0" of the data of an odd page within the same word line (or a an ECC replaced unit within the same word line) and generates a count value. The data counter 3011 transfers the data received from interface circuit 110 to the latch section 10813 and provides a counter value to the operation comparison control section 30112.

Next, in step ST302, the operation comparison control section 30112 calculates the exclusive OR (XOR) of the data couple of adjacent even and an odd pages of the memory cell array 201, based on the count value provided from data counter 30112, counts the number of adjoining "1" data and "0" data and generates an adjacent number count value. Next, in step ST303, the operation comparison control section 30112 judges whether the adjacent number count value is more than half of the number of page data (constant value) and generates a number judgment result.

Instep ST303, in the case where the number judgment result which shows whether the adjacent number count value is more than half of the number of page data (prescribed value) (step ST303: YES) then the operation comparison control section 30112 generates an inversion value which inverts the polarity of the data of an odd page or the data of said even page (step ST304) and provides it to latch section 10813 and data transfer section 10814.

The latch section 10813 adds an odd page inversion flag bit and an even page inversion flag bit which is based on the inversion data which inverts the polarity of the data of an odd page or an even page and sends it to data transfer section 10814 (step ST304).

The data transfer section 10814 inverts the odd page or even page data from the latch section 10813 based on the inversion data, which was provided by the operation comparison control section 30112 and transfers it memory cell array 201 (step ST305).

Also, in step ST303, in the case where the number judgment result shows that the adjacent number count value is less than half of the page data (prescribed value) then the operation comparison control section 30112 generates an inversion data (step ST306) which inverts or does not invert the polarity of the data of both an odd page or an even page and provides this to latch section 10813 and the data transfer section 10814.

The latch section 10813 adds an odd page inversion flag bit and an even page inversion flag bit, which shows the inversion data transferred from the operation comparison control section 30112, to the data which was transferred from the data counter 30111 and provides this to the data transfer section 10814 (step ST306).

Next, the data transfer section 10814 inverts or does not invert the data which was output from the latch section 10813 based in the inversion data which was output from the operation comparison control section 30112 and transfers this to the memory cell array 210 (step ST207). After step ST305 and step 307 the data transfer section 10814 judges whether the transfer of data has ended (step ST308) and the operation returns to step ST301 if the transfer of data has not ended.

According to embodiment 3 of the present invention, because it is possible to invert the polarity of data of an odd page or an even page in the case where the number judgment result shows that the adjacent number count value is more than half (prescribed value) of the number of page data and store this in a memory cell and because it is possible to reduce the consumption current for charging a bit line in the case of data write it is possible to reduce consumption current for charging a bit line in the case of data write. Also, according to embodiment 3 of this invention, under the condition that the peak current for charging a bit line is constant it is possible to quicken data write operation.

Embodiment 4

Figure 14:
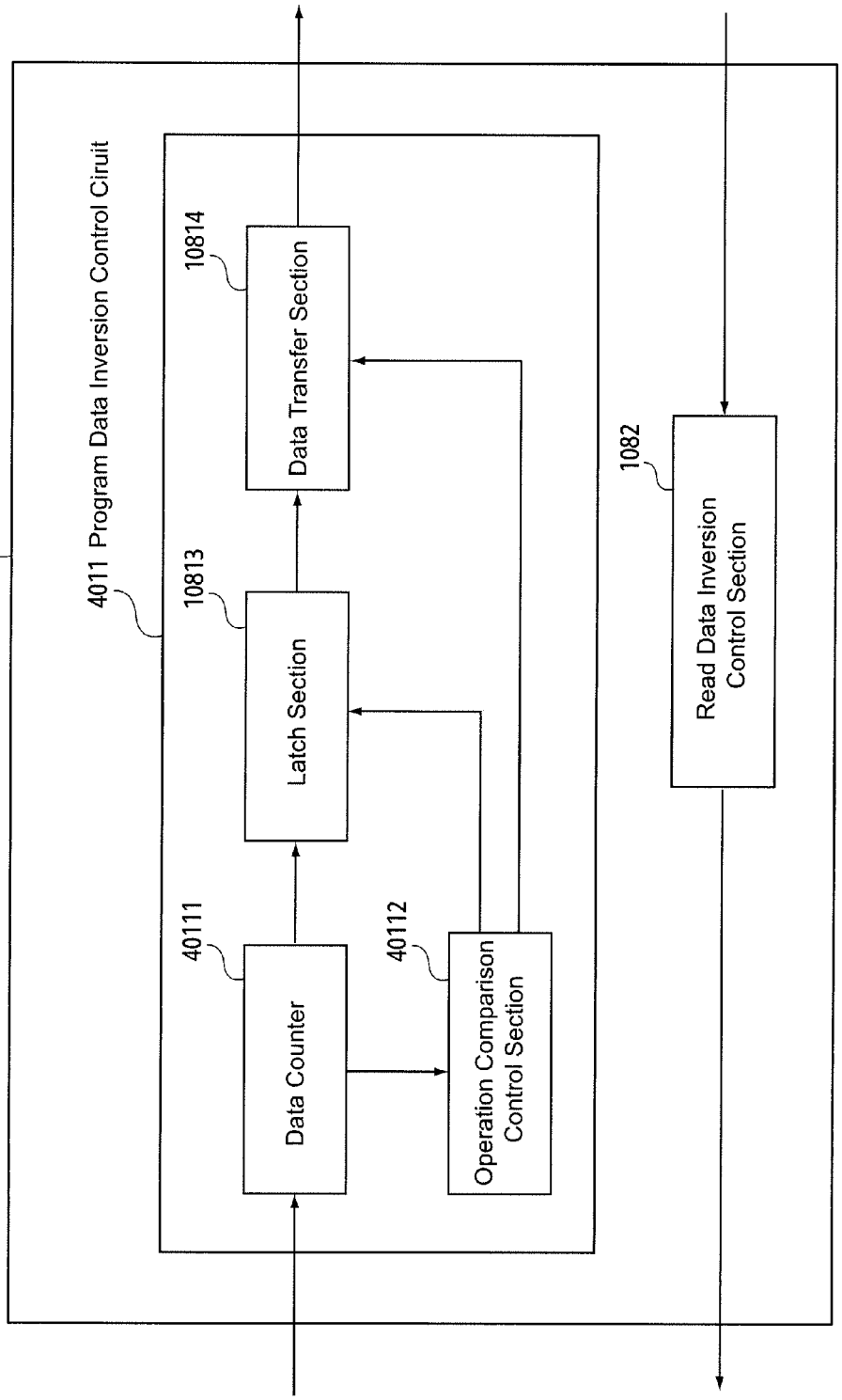
FIG. 14 is a block diagram which showing the data inversion control circuit of a fourth embodiment of a NAND type flash memory in the present invention.

Next, embodiment 4 of the present invention will be explained in detail while referring to the drawings. FIG. 14 is a block diagram which shows a data inversion control circuit of the NAND type flash memory device 400 related to embodiment 4 of this invention. In embodiment 4 of this invention, because the same reference symbols have been attached to the same component parts as embodiment 2 they will not be explained here.

As shown in FIG. 14, the NAND type flash memory device 400 related to embodiment 4 of this invention has, instead of the data inversion control circuit 203 of the NAND type flash memory device 200 of embodiment 2 of this invention, a data inversion control circuit 401.

As shown in FIG. 14, the data inversion control circuit 401 is provided with a program data inversion control circuit 4011 and a read data inversion control circuit 1082. The program data inversion control circuit 4011 is provided with a data counter 40111, an operation comparison control section 40112, a latch section 10813 and a data transfer section 10814.

Figure 15:
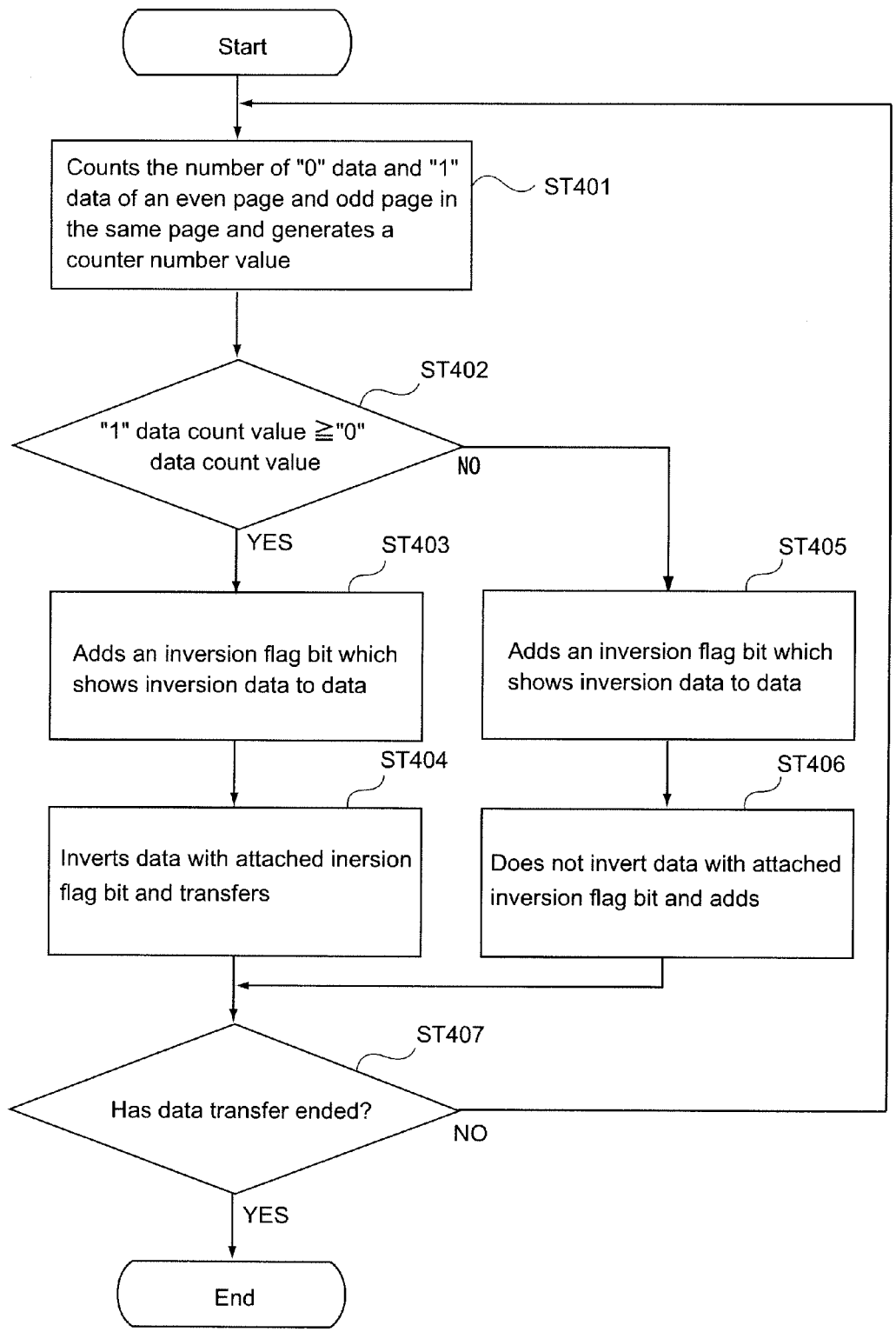
FIG. 15 is a flowchart which explains the operation of a data inversion control circuit of the fourth embodiment of a NAND type flash memory in the present invention.

FIG. 15 is a flow chart which explains the operation of data inversion control circuit 401 of a NAND type flash memory 400 related to embodiment 4 of this invention. Next, the operation of data inversion control circuit 401 of a NAND type flash memory 400 related to embodiment 4 of this invention will be explained in detail referring to FIG. 15.

As shown in FIG. 15, in step ST401, the data counter 4011 receives data from the interface circuit 110 through the data register 109 and ECC circuit 107, counts the number of "1" data and "0" data of the data of an even page and the number of "1" data and "0" of the data of an odd page within the same word line (or a an ECC replaced unit within the same word line) and generates a count value. Then, the data counter 4011 transfers the data received from interface circuit 110 to the latch section 10813 and provides a "1" data counter value and a "0" data counter value to the operation comparison control section 40112.

Next, in step ST402, the operation comparison control section 40112 compares the difference between the "1" data counter value and the "0" data counter value from the data counter 40111 and generates a comparison result.

In step ST402, when the comparison result shows that the "1" data counter value is more than the "0" data counter value, the operation comparison control section 40112 provides an inversion data which shows the inversion of the polarity of "1" data to the latch section 10813 and the data transfer section Next, in step ST403, the latch section 10813 adds an inversion flag bit, which shows the inversion data provided by operation comparison control section 40112, to the data transferred from data counter section 40111 and provides this to the data transfer section 10814. Next, in step ST404, the data transfer section 10814 inverts the data attached with an inversion flag bit and transfers it to the memory cell array 201.

Next, in step ST402, when the comparison result shows that "1" data counter value is less than "0" data counter value, the operation comparison control section 40112 provides an inversion data which shows that the polarity of "1" data or "0" data is not to be inverted, to the latch section 10813 and the data transfer section 10814.

Next, in step ST405, the latch section 10813 adds an inversion flag bit, which shows the inversion data provided by operation comparison control section 40112, to the data transferred from data counter section 40111 and provides this to the data transfer section 10814. Next, in step ST406, the data transfer section 10814 does not invert the data attached with an inversion flag bit and transfers it to the memory cell array 201.

After, step ST404 and step ST406, the data transfer section 10814 judges whether the transfer of data has ended (step ST407) and the operation returns to step ST401 if the transfer of data has not ended.

According to embodiment 4 of the present invention, when a comparison result shows that "1" data counter value is greater than "0" data counter value, because it is possible to invert the polarity of "1" data and store it in a memory cell it is also possible to reduce consumption current at the time of data read from the memory cell.

Embodiment 5

Figure 16:
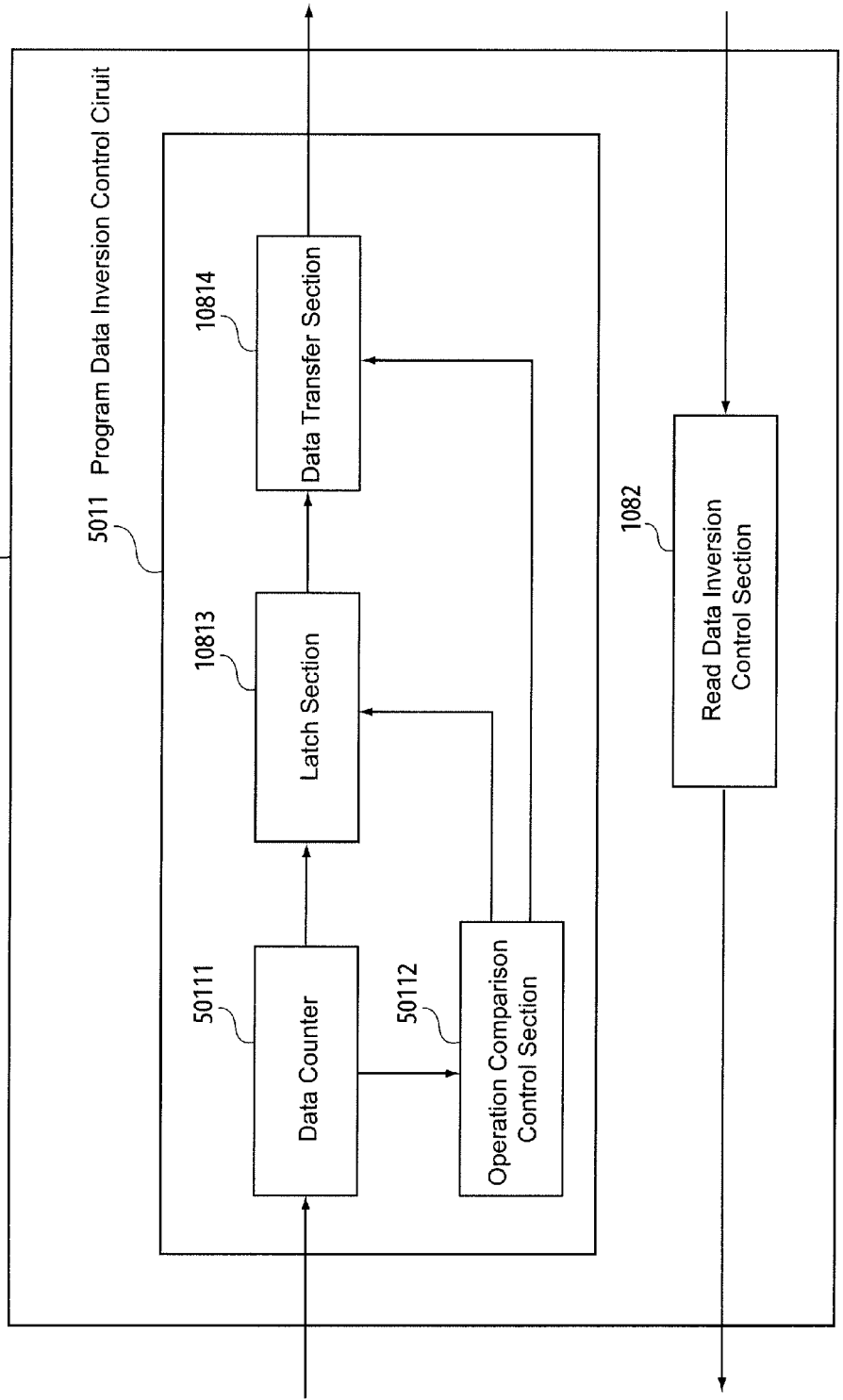
FIG. 16 is a flowchart which showing the data inversion control circuit of a fifth embodiment of a NAND type flash memory in the present invention.

Next, embodiment 5 of the present invention will be explained in detail while referring to the drawings. FIG. 16 is a block diagram which shows a data inversion control circuit of the NAND type flash memory 500 related to embodiment 5 of this invention. In embodiment 5 of this invention, because the same reference symbols have been attached to the same component parts as embodiment 2 they will not be explained here.

As shown in FIG. 16, the NAND type flash memory 500 related to embodiment 5 of this invention has, instead of the data inversion control circuit 203 of the NAND type flash memory 200 of embodiment 2 of this invention, a data inversion control circuit 501.

As shown in FIG. 16, the data inversion control circuit 501 is provided with a program data inversion control circuit 5011 and a read data inversion control circuit 1082. The program data inversion control circuit 5011 is provided with a data counter 50111, an operation comparison control section 50112, a latch section 10813 and a data transfer section 10814

Figure 17:
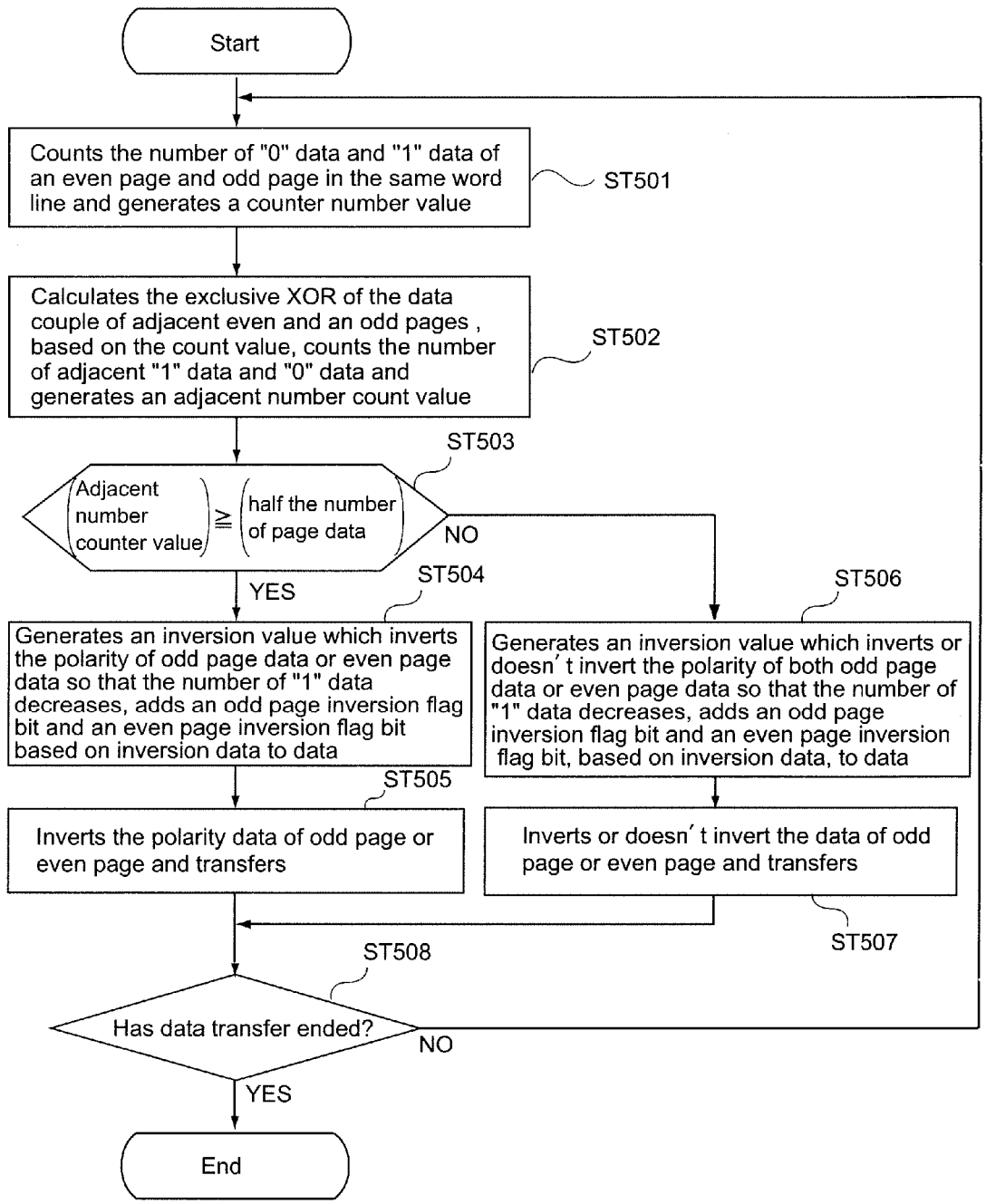
FIG. 17 is flowchart which explains the operation of the data inversion control circuit of the fifth embodiment of a NAND type flash memory in the present invention.

FIG. 17 is a flow chart which explains the operation of data inversion control circuit 501 of a NAND type flash memory 500 related to embodiment 5 of this invention. Next, the operation of data inversion control circuit 501 of a NAND type flash memory 500 related to embodiment 5 of this invention will be explained in detail referring to the FIG. 17.

As shown in FIG. 17, in step ST501, the data counter 50111 receives data from the interface circuit 110 through the data register 109 and ECC circuit 107, counts the number of "1" data and "0" data of the data of an even page and the number of "1" data and "0" of the data of an odd page within the same word line (or a an ECC replaced unit within the same word line) and generates a count value. Then, the data counter 50111 transfers the data received from interface circuit 110 to the latch section 10813 and provides a counter value to the operation comparison control section 50112.

Next, in step ST502, the operation comparison control section 50112 calculates the exclusive OR (XOR) of the data couple of adjacent even and an odd pages of the memory cell array 201, based on the count value provided from data counter 50112, counts the number of adjoining "1" data and "0" data and generates an adjacent number count value. The operation comparison control section 50112 judges whether the adjacent number count value is more than half of the number of page data (prescribed value) and generates a number judgment result (step ST503).

In step ST503, in the case where the number judgment result which shows whether the adjacent number count value is more than half of the number of page data (prescribed value) then the operation comparison control section 50112 generates an inversion data which inverts the polarity of the data of an odd page or the data of an even page (step ST504), so that the number of "1" data decreases and provides it to latch section 10813 and data transfer section 10814.

The latch section 10813 adds an odd page inversion flag bit and an even page inversion flag bit which is based on the inversion data which inverts the polarity of the data of an odd page or an even page and transfers it to data transfer section 10814 (step ST504).

Next, in step ST505, the data transfer section 10841 inverts the polarity of the data of an odd page or the data of an even page and transfers it to the memory cell array 201.

Also, in step ST503, in the case where the number judgment result shows that the adjacent number count value is less than half of the page data (prescribed value) then the operation comparison control section 50112 generates an inversion data (step ST506) which inverts or does not invert the polarity of the data of both an odd page or an even page so that the number of "1" data decreases and provides this to latch section 10813 and the data transfer section 10814.

The latch section 10813 adds an odd page inversion flag bit and an even page inversion flag bit which shows the inversion data provided by operation comparison control section 50112 to the data which was transferred from data counter section 50111 and transfers it to data transfer section 10814 (step ST506)

Next, the data transfer section 10814 does not invert or inverts the data provided from latch section 10813 based on the inversion data provided by operation comparison control section 50112 and transfers it to memory cell array 101 (step ST507)

Figure 18:
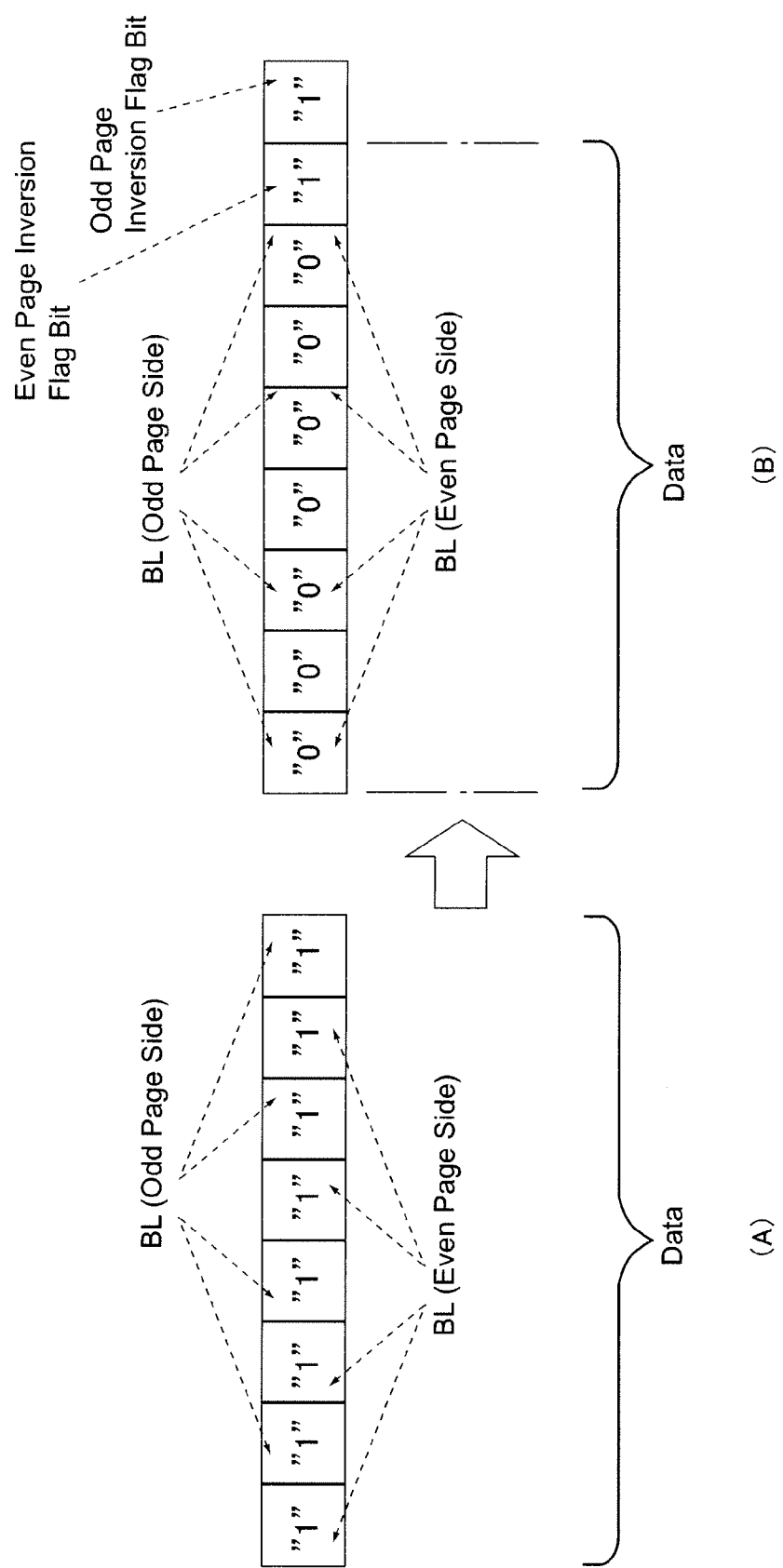
FIG. 18(A) is a diagram which showing one example of the bit line data pattern which the data inversion control circuit receives of the fifth embodiment of a NAND type flash memory in the present invention.
FIG. 18(B) is a diagram which showing one example of the data pattern which the data inversion control circuit outputs of the fifth embodiment of a NAND type flash memory in the present invention.

For example, in the case where the bit line data has a polarity shown in FIG. 18(A) the operation comparison control section 50112 generates an inversion data which inverts the polarity of data of an even page and provides it to the latch section 10813 and data transfer section 10814. The latch section 10813 adds an odd page inversion flag bit and an even page inversion flag bit to the data as shown in FIG. 18(B) and provides this to the data transfer section 10814. The data transfer section 10814 inverts the polarity of the data of an even page and provides this to the memory cell array 201 through the column decoder 103, sense amplifier circuit 105 and the selection circuit 104.

As shown in FIG. 17, after step ST505 and step ST507, the data transfer section 10814 judges whether the transfer of data has ended (step ST508) and the operation returns to step ST501 if the transfer of data has not ended.

In the case where the inversion flag bit shows that the polarity of the data has been inverted at the time of reading data which has been stored in the memory cell array, the NAND type flash memory related to embodiments 1 to 5 of this invention inverts the data which has been stored in the memory cell array and reads it. The NAND type flash memory related to embodiments 1 to 5 of this invention can return the data received from another device to its original state and transfer it.

According to embodiment 5 of the present invention, because it is possible to invert the polarity of data of an odd page or an even page so that the number of "1" data decreases in the case where the adjacent number count value is more than half (prescribed value) of the number of page data and store this in a memory cell and because it is possible to invert or not invert the polarity of both the data of an odd page and an even page so that the number of "1" data decreases in the case where the adjacent number count value is less than half (constant value) of the number of page data and store this in a memory cell and because it is possible to reduce the consumption current for charging a bit line in the case of data write it is possible to reduce consumption current for charging a bit line in the case of data read from the memory cell. Therefore, it is possible to reduce consumption current both at the time of data read and data write. Also, according to embodiment 5 of this invention, under the condition that the peak current for charging a bit line is constant it is possible to quicken data write operation.

Embodiment 6

Figure 19:
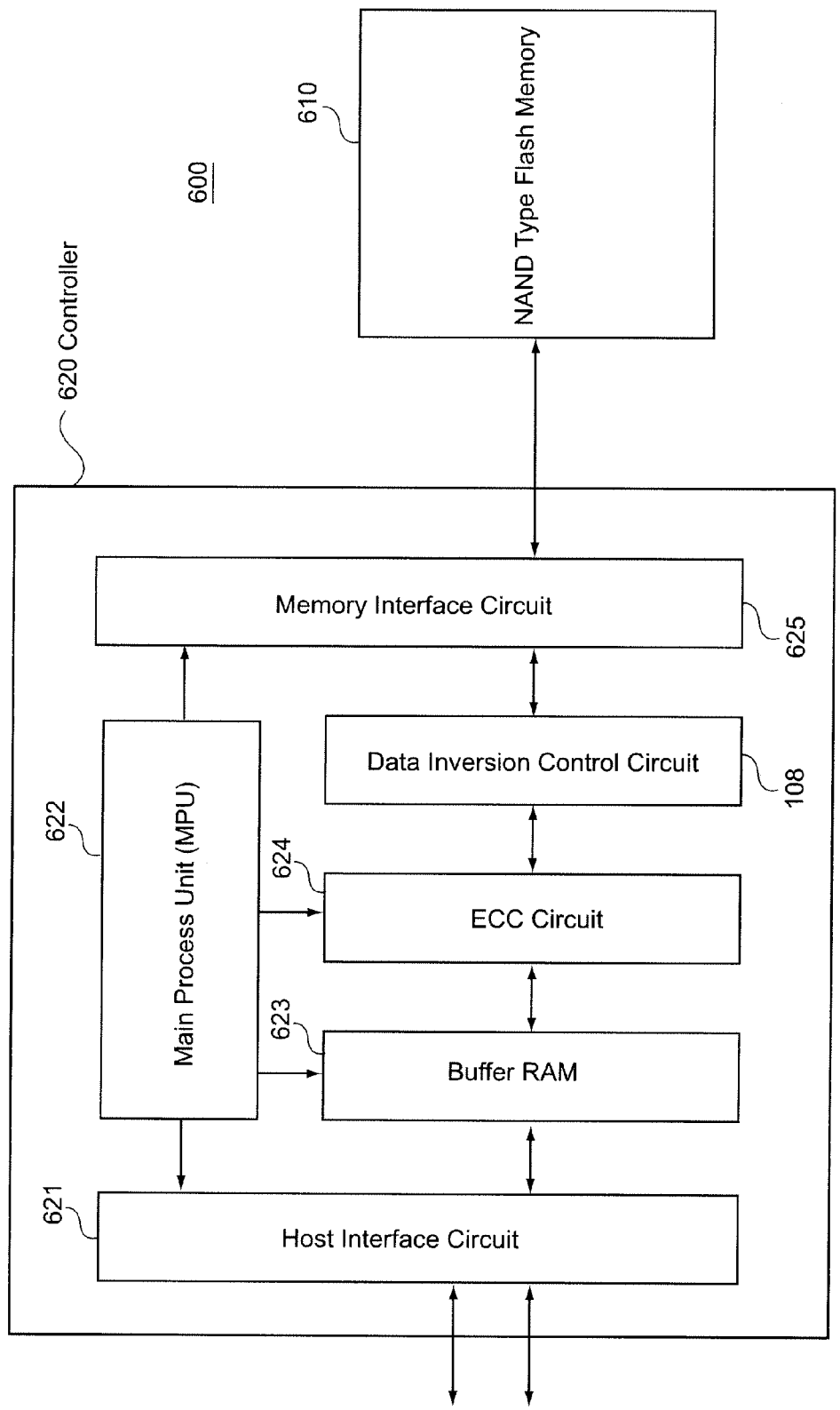
FIG. 19 is a block diagram which showing a memory device of a sixth embodiment of the present invention.

Next, embodiment 6 of the present invention will be explained in detail while referring to the drawings. FIG. 19 is a block diagram which shows a memory related to embodiment 6 of this invention. In embodiment 6 of this invention, because the same reference symbols have been attached to the same component parts as embodiment 1 they will not be explained here.

As shown in FIG. 19, the memory 600 related to embodiment 6 of this invention, is provided with a NAND type flash memory 610 and a controller 620 which controls this NAND type flash memory.

The NAND type flash memory device 610 does not remove the data inversion control circuit 108 in the NAND type flash memory device 100 related to embodiment 1 of this invention.

The controller 620 is provided with a host interface circuit 621, a main process device (MPU) 622, a buffer RAM 623, an ECC circuit 624, a data inversion control circuit 108 and a memory interface circuit 625.

The main process device 622 performs sending and reception of control signals within the host side device through the host interface circuit 621. The buffer RAM 623 temporarily holds data and performs sending and reception of control signals within the host side device through the host interface circuit 621.

The main process device 622 controls the host interface circuit 621, the buffer RAM 623, the ECC circuit 624, the data inversion control circuit 108 and the memory interface circuit 625 based on the control signals from the host side device.

The buffer RAM 623 temporarily holds data output from the host interface circuit 621 and transfers it to the ECC circuit 624. The ECC circuit 624 checks for errors in the data transferred from the buffer RAM 623, fixes any errors and provides the fixed data to the data inversion control circuit 108.

The data inversion control circuit 108 receives the data from the ECC circuit 624 and by performing a similar operation as in embodiment 1 of this invention provides the data to the memory interface circuit 625. The main process device 622 performs sending and receiving of controls signal with the NAND type flash memory 610 through the memory interface circuit 625.

The memory interface circuit 625 appropriately processes the data provided from the data inversion control circuit 108 and after processing provides the data to the NAND type memory flash 101. The NAND type memory flash device 101 stores the data provided by the memory interface circuit 625. This data has an inversion flag bit added by the data inversion control circuit 108.

The memory interface circuit 625 appropriately processes the data output from the NAND type memory flash 101 and transfers the processed data to the data inversion control circuit 108. The data inversion control circuit 108 performs above-mentioned processing on the data transferred from the memory interface circuit 625 and provides the processed data to the ECC circuit 624.

The ECC circuit 624 checks for errors in the data output from the memory interface 625, fixes any errors and provides the fixed data to the buffer RAM 623. The buffer RAM 623 temporarily holds the data provided by the ECC circuit 624 and transfers it to the host interface circuit 621.

Further, the controller 620 of the memory 600 related to embodiment 6 of this invention can be composed of any one of data inversion control circuits 203, 201, 401 or 501 instead of data inversion control circuit 108.

Embodiment 6 of the present invention has the same effects as any one of the embodiments 1 to 5 of this invention.

According to the invention related to claim 1 to claim 5, it is possible to reduce consumption current at the time of data program and under the condition that the peak current for charging a bit line is constant it is possible to quicken data write operation.

In addition, as one embodiment in the present invention, the data inversion control section of a NAND type flash memory having the data counter that counts the number of "1" data and the number of "0" data of the plurality of memory cell data within the simultaneous data program unit and is provided with a data counter which generates a "1" data counter value and a "0" data counter value, and the comparator that compares the difference between the "1" data counter value and the "0" data counter value and generates a comparison result, wherein when the comparison result shows that the "1" data counter value is more than the "0" data counter value, the polarity of data related to this comparison result is inverted.

According to this construction, it is possible to reduce consumption current at the time of data read from the memory cell.

In addition, as another embodiment in the present invention, a NAND type flash memory having the data inversion control section calculates the exclusive OR (XOR) of the data couple of adjacent even and an odd pages of the memory cell array is taken, the number of adjoining the "1" data and the "0" data is counted and an adjacent number count value is generated and the polarity of the data of the odd page or the even page is inverted so that the number of the "1" data decreases in the case where the adjacent number count value is more than half the number of page data, the polarity of both the data of the odd page or the even page is inverted or not inverted so that the number of the "1" data decreases in the case where the adjacent number count value is less than half the number of the page data.

According to this construction, it is possible to reduce consumption current at the time of data write and under the condition that the peak current for charging a bit line is constant it is possible to quicken data write operation and it is possible to reduce consumption current at the time of data read from the memory cell.

Also, the memory device related to another embodiment in the present invention can be composed of the NAND type flash memory provided with a sense amplifier circuit wherein; the sense amplifier circuit is provided with a plurality of sense amplifiers wherein one of the sense amplifiers is connected to two bit lines through a switch circuit, the switch circuit selects only one of the bit lines based on selection data and in the NAND type flash memory device which is connected to one of the sense amplifiers, the data inversion control section counts the number of "1" data and the number of "0" data of the data of the plurality of memory cells within the simultaneous data program unit and a data counter generates a "1" data counter value and a "0" data counter value, a comparator compares the difference between the "1" data counter value and the "0" data counter value and generates a comparison result and when the comparison result shows that the "1" data counter value is smaller than the "0" data counter value, the data related to the comparison result is inverted.

According to this construction, it is possible to reduce consumption current at the time of data write and under the condition that the peak current for charging a bit line is constant it is possible to quicken data write operation.

Also, the memory device related to another embodiment in the present invention can be composed of the NAND type flash memory provided with the sense amplifier circuit wherein the sense amplifier circuit is provided with a plurality of sense amplifiers and in the NAND type flash memory connected to one bit line by one of the sense amplifiers, the exclusive OR (XOR) of the data couple of adjacent even and an odd pages of the memory cell array is taken and the data inversion control section inverts the polarity of the data of the odd page or the even page so that the number of adjacent the "1" data and the "0" data becomes fewer.

According to this construction, it is possible to reduce consumption current at the time of data write and under the condition that the peak current for charging a bit line is constant it is possible to quicken data write operation.

Also, the memory device related to another embodiment in the present invention can be composed of the data inversion control section wherein the exclusive OR (XOR) of the data couple of adjacent even and odd pages of the memory cell array is taken, the number of adjacent the "1" data and the "0" data are counted and an adjacent number counter value is generated and when the adjacent number count value is more than half of the data of a page the polarity of the data of the odd page or the even page is inverted and when the adjacent number count value is less than half of the data of a page the polarity of both the data of the odd page and the even page are not inverted or inverted.

According to this construction, it is possible to reduce consumption current at the time of data write and under the condition that the peak current for charging a bit line is constant it is possible to quicken data write operation.

We claim:

1. A NAND type flash memory comprising:
   a memory cell array composed of a plurality of electronically rewritable memory cells arranged in a matrix shape;
   a sense amplifier circuit provided with a plurality of sense amplifiers;
   a selection circuit which selects only one of two bit lines of the memory cell array based on a selection data and connects one of the two bit lines to one of the sense amplifiers;
   a data counter which counts the number of "1" data and the number of "0" data of a data sent to a plurality of memory cells within a simultaneous data program unit and generates a "1" data counter value and a "0" data counter value;
   a comparator which compares a difference between the "1" data counter value and the "0" data counter value and generates a comparison result; and
   a data inversion control section which judges whether a polarity of a "1" data or a "0" data is to be inverted based on the comparison result between the "1" data counter value and the "0" data counter value when data is sent to the plurality of memory cells within a simultaneous write data unit and inverts the data and in the case where it is sent to the memory cell array adds an inversion flag bit to the data which shows the inversion of the polarity.

2. The NAND type flash memory according to claim 1, wherein the data inversion control section inverts the polarity of data related to the comparison result when the comparison result shows that the "1" data counter value is smaller than the "0" data counter value.

3. The NAND type flash memory according to claim 2 wherein, the data counter counts the number of the "1" data and the number of the "0" data of data of an odd page and an even page in a same block in the memory array and generates a "1" data count value and a "0" data count value;

the comparator compares the difference between the "1" data counter value and the "0" data counter value of the odd page and the even page in the same block in the memory array and generates a comparison result; and the data inversion control section inverts polarity of data related to the comparison result when the comparison result shows that the "1" data counter value is smaller than the "0" data counter value of the odd page and the even page in the same block in the memory array.

4. The NAND type flash memory according to claim 3 wherein, the data inversion control section adds an inversion flag bit which shows that polarity of data of the same odd page and the even page in the same block is not to be inverted or is to be inverted, to the data.

5. The NAND type flash memory according to claim 4 wherein, a data transfer section does not invert or inverts the polarity of the data added with the inversion flag bit and transfers the data to the memory cell array.

6. The NAND type flash memory according to claim 1, wherein the data inversion control section inverts the polarity of the "1" data when the comparison result shows that the "1" data counter value is smaller than the "0" data counter value.

7. The NAND type flash memory according to claim 1, wherein the data inversion control section does not invert the polarity of the "1" data or the "0" data when the comparison result shows that the "1" data counter value is smaller than the "0" data counter value.

8. The NAND type flash memory according to claim 1, wherein a data transfer section inverts the polarity of the "1" data added with the inversion flag bit and transfers the "1" data to the memory cell array.

9. The NAND type flash memory according to claim 1, wherein a data transfer section does not invert the polarity of the "0" data added with the inversion flag bit and transfers the "0" data to the memory cell array.

10. A NAND type flash memory comprising:
    a memory cell array composed of a plurality of electronically rewritable memory cells arranged in a matrix shape;
    a sense amplifier circuit provided with a plurality of sense amplifiers wherein one of the sense amplifiers is connected to 1 bit line; and
    a data inversion control section which calculates an exclusive OR of a data couple of adjacent even and odd pages of the memory cell array and inverts the polarity of the data of the odd page or the even page so that the number of adjacent "1" data and "0" data becomes fewer.

11. The NAND type flash memory according to claim 10, wherein the data inversion control section adds an odd page inversion flag bit or an even page inversion flag bit, which shows that the polarity of the data of the odd page or the even page has been inverted, to the data.

12. The NAND type flash memory according to claim 11, wherein a data transfer section inverts or does not invert the polarity of the data added with the odd page inversion flag bit or the even page flag bit and transfers the data to the memory cell array.

13. The NAND type flash memory according to claim 10, wherein the data inversion control section calculates the exclusive OR of the data couple of adjacent even and odd pages of the memory cell array, counts the number of adjacent the "1" data and the "0" data and generates an adjacent number counter value, when the adjacent number count value is more than half of the data of a page, the polarity of the data of the odd page or the even page is inverted and when the adjacent number count value is less than half of the data of a page, the polarity of both the data of the odd page and the even page are not inverted or inverted.

14. The NAND type flash memory according to claim 13 wherein, the data inversion control section adds an odd page inversion flag bit or an even page inversion flag bit, which shows that the polarity of the data of the odd page or the even page has been inverted, to said data.

15. The NAND type flash memory according to claim 14 wherein, a data transfer section inverts the polarity of the data added with the odd page inversion flag bit or the even page flag bit and transfers data to the memory cell array.

16. The NAND type flash memory according to claim 13 wherein, the data inversion control section adds an odd page inversion flag bit or an even page inversion flag bit, which shows that the polarity of both the data of the odd page and the even page is not to be inverted or is to be inverted, to the data.

17. The NAND type flash memory according to claim 16 wherein, a data transfer section inverts or does not invert the polarity of the data added with the odd page inversion flag bit or the even page flag bit and transfers data to the memory cell array.

18. The NAND type flash memory according to claim 10 wherein, the data inversion control section calculates the exclusive OR of the data couple of adjacent even and odd pages within the same word line of the memory cell array, counts the number of adjacent the "1" data and the "0" data and generates an adjacent number counter value, when the adjacent number count value is more than half of the data of a page, polarity of data of the odd page or the even page is inverted and when the adjacent number count value is less than half of the data of the page, the polarity of both the data of the odd page and the even page are not inverted.

19. The NAND type flash memory according to claim 18 wherein, the data inversion control section adds an odd page inversion flag bit or an even page inversion flag bit, which shows that polarity of data of the odd page or the even page in the same word line of the memory array, is to be inverted, to the data.

20. A memory device comprising:
a NAND type flash memory provided with a memory cell array wherein a plurality of electronically rewritable memory cells are placed in a matrix form;
a sense amplifier circuit provided with a plurality of sense amplifiers;
a selection circuit which selects only one of two bit lines of the memory cell array based on selection data and connects one of the two bit lines to one of the sense amplifiers; and
a controller which controls the NAND type flash memory device;
the controller having a data counter which counts a number of "1" data and a number of "0" data of a data sent to the plurality of memory cells within a simultaneous data program unit and generates a "1" data counter value and a "0" data counter value;
a comparator which compares a difference between the "1" data counter value and the "0" data counter value and generates a comparison result; and
judges whether the polarity of the "1" data or the "0" data is to be inverted based on the comparison result between the "1" data counter value and the "0" data counter value when data is transferred to said plurality of memory cells within the simultaneous data write unit,
a data inversion control section which adds an inversion flag bit which shows that the polarity has been inverted in the case when the data is inverted and transferred to the memory cell array.

21. A memory device comprising:
a NAND type flash memory provided with a memory cell array wherein a plurality of electronically rewritable memory cells are placed in a matrix form;
a sense amplifier circuit provided with a plurality of sense amplifiers;
a controller which controls the NAND type flash memory device; and the controller having a data inversion control section which calculates a exclusive OR of a data couple of adjacent even and odd pages of the memory cell array and inverts the polarity of the data of the odd page or the even page so that the number of adjacent "1" data and "0" data becomes fewer.

* * * * *